United States Patent
Metts et al.

(10) Patent No.: US 12,235,300 B1
(45) Date of Patent: Feb. 25, 2025

(54) SYSTEMS AND METHODS FOR POWER EVENT NOTIFICATION

(71) Applicant: Cable Television Laboratories, Inc., Louisville, CO (US)

(72) Inventors: Nicolas Joel Metts, Superior, CO (US); Scott L. Caruso, Arvada, CO (US); Stephen Arendt, Longmont, CO (US); Scott H. Clearwater, Menlo Park, CA (US)

(73) Assignee: Cable Television Laboratories, Inc., Louisville, CO (US)

( * ) Notice: Subject to any disclaimer, the term of this patent is extended or adjusted under 35 U.S.C. 154(b) by 3 days.

(21) Appl. No.: 17/452,543

(22) Filed: Oct. 27, 2021

Related U.S. Application Data

(60) Provisional application No. 63/220,618, filed on Jul. 12, 2021, provisional application No. 63/164,330, filed on Mar. 22, 2021, provisional application No. 63/106,052, filed on Oct. 27, 2020.

(51) Int. Cl.
*G01R 22/06* (2006.01)
*G01R 31/58* (2020.01)

(52) U.S. Cl.
CPC ......... *G01R 22/068* (2013.01); *G01R 22/063* (2013.01); *G01R 31/58* (2020.01)

(58) Field of Classification Search
CPC ..... G01R 22/068; G01R 31/58; G01R 22/063
See application file for complete search history.

(56) References Cited

U.S. PATENT DOCUMENTS

| | | | | |
|---|---|---|---|---|
| 9,297,723 | B1* | 3/2016 | Hofmann | G06N 20/00 |
| 10,001,518 | B2* | 6/2018 | Cheim | G05B 23/024 |
| 2012/0316689 | A1* | 12/2012 | Boardman | H02J 13/00028 |
| | | | | 700/297 |
| 2013/0049764 | A1* | 2/2013 | Koliwad | G01R 31/086 |
| | | | | 324/522 |
| 2016/0011618 | A1* | 1/2016 | Janous | G05B 15/02 |
| | | | | 700/291 |
| 2018/0018640 | A1* | 1/2018 | Li | G06Q 10/20 |
| 2020/0293627 | A1* | 9/2020 | Wang | G06F 30/367 |

OTHER PUBLICATIONS

N. Cross, R. Herman and C. T. Gaunt, "Investigating the usefulness of the Beta pdf to describe Parameters in Reliability Analyses," 2006 International Conference on Probabilistic Methods Applied to Power Systems, Stockholm, Sweden, 2006, pp. 1-6, doi: 10.1109/PMAPS.2006.360299. (Year: 2006).*

* cited by examiner

*Primary Examiner* — Son T Le
*Assistant Examiner* — Brian Butler Geiss
(74) *Attorney, Agent, or Firm* — PdZ Patent Law, PLLC

(57) ABSTRACT

A method for power event notification includes (a) receiving, from a plurality of sensors at different respective locations within an area served by an electric power grid, a respective data set from each sensor, each data set including metadata associated with its respective sensor and electric power data generated by its respective sensor, (b) identifying, from at least one of the data sets, occurrence of an electric power event in the electric power grid, and (c) generating a notification of the electric power event.

28 Claims, 8 Drawing Sheets

SYSTEMS AND METHODS FOR POWER EVENT NOTIFICATION

RELATED APPLICATIONS

This application claims benefit of priority to (a) U.S. Provisional Patent Application Ser. No. 63/106,052, filed on Oct. 27, 2020, (b) U.S. Provisional Patent Application Ser. No. 63/164,330, filed on Mar. 22, 2021, and (c) U.S. Provisional Patent Application Ser. No. 63/220,618, filed on Jul. 12, 2021. Each of the aforementioned patent applications is incorporated herein by reference.

BACKGROUND

An electric power grid may experience a power event, such as a power outage, an abnormal voltage, or an abnormal frequency. A power event may be caused, for example, by severe weather, equipment failure, equipment damage, or extreme load conditions. Many parties have an interest in being notified of a power event. For example, electric utilities want to be notified of power failures and other power events so that they can quickly address these issues. Additionally, electric utilities are interested in historical power events so that they can investigate these events and take steps to prevent their reoccurrence. Furthermore, public safety agencies have great interest in timely notification of power outages, as well as timely notification of power restoration, so that the agencies can quickly and accurately deploy resources to areas experiencing a power outage. Moreover, insurance companies have an interest in historical power events, such as when adjusting claims associated with past power outages.

DETAILED DESCRIPTION OF THE EMBODIMENTS

Figure 1:
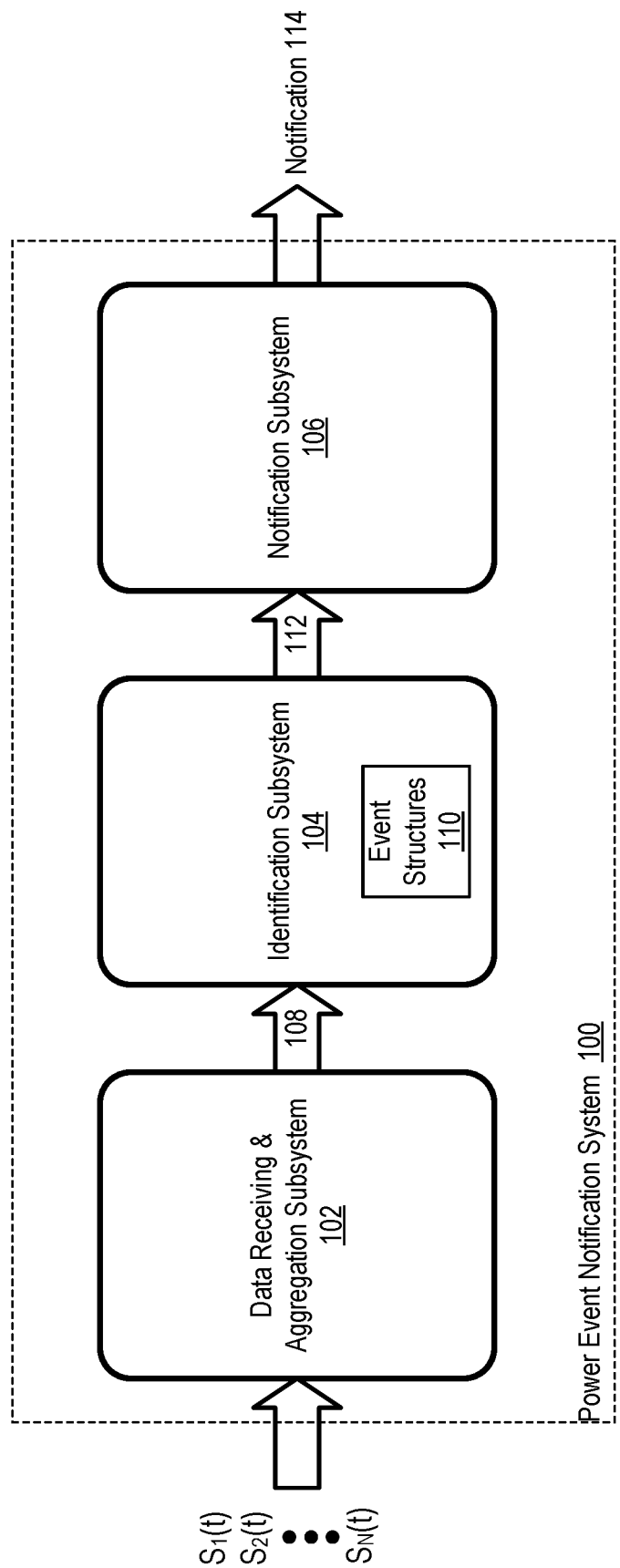
FIG. 1 is a block diagram of a power event notification system, according to an embodiment.

Conventional power outage notification systems typically operate by "scraping," i.e., collecting, information from electric utility web sites, to provide information on power outages. While these conventional systems are valuable, they have their shortcomings. For example, conventional power outage notification systems are only capable of providing a high-level overview of power outages, such as by indicating that a particular state or a particular county is experiencing a power outage. Consequently, these systems are incapable of providing detailed locations of power outages, which makes these systems of limited use in addressing power outages. For instance, a public safety agency generally cannot rely on a conventional power outage notification system to determine whether to deploy resources to address a power outage because the conventional system does not provide a sufficiently detailed location of the outage. Additionally, conventional power outage notification systems are generally incapable of providing real time notification of power outages (or real time notification of power restoration). Consequently, data from conventional systems may be significantly out-of-date, which further limits usefulness of the data.

Furthermore, conventional power outage notification systems often cannot provide information on distribution-level power outages, due to lack of electric utility Supervisory Control and Data Acquisition (SCADA) equipment in electric power distribution systems. This shortcoming is particularly significant because most electric power outages occur at the distribution level, rather than at the transmission level. Moreover, conventional power outage notification systems generally cannot provide information on short duration power outages because electric utilities typically do not report such power outages on their web sites.

Disclosed herein are systems and methods for power event notification which at least partially overcome the above-discussed shortcomings of conventional power outage notification systems. Certain embodiments are capable of automatically providing notification of an electric power event, including but not limited to, a power outage, an abnormal electric power grid voltage, and/or an abnormal electric power grid frequency, at a higher level of granularity than is possible with conventional power outage notification systems. For example, some embodiments can identify an electric power event location down to a particular cell of the United States National Grid (USNG) projection system, or other mapping system, thereby providing much higher granularity in power event location than conventional systems. Additionally, particular embodiments obtain data from sensors that are "out of band" with respect to the electric power grid that they are monitoring, i.e., the sensors are separate from the electric power grid that they are monitoring. Consequently, the new systems and methods do not rely on the electric power grid itself, or an electric utility operating the grid, to provide sensor data. As a result, the new systems and methods provide an independent, non-biased, and reliable view of electric power grid operation even if the electric power grid, or internal monitoring equipment within the electric power grid, is compromised.

Furthermore, certain embodiments can provide notification of an electric power event on a substantially real-time basis, or even essentially on a real-time basis, such as every millisecond, every second, every minute, every five minutes, every ten minutes, every half hour, every hour, etc. Therefore, the new systems and methods can provide more timely notification of a power outage, power restoration, or another electric power event, than conventional power outage notification systems. Moreover, some embodiments leverage networks of sensors that are widely deployed across an electric power grid, such as a network of sensors in communication infrastructure within the area of the electric power grid, by analyzing sensor data in space and time to identify electric power events and optionally categorize the events by magnitude, duration, and/or impact. Such ability to analyze data from many sensors, e.g., sensors spread across multiple electric utility service areas, enables certain embodiments to identify an electric power event that may not be identifiable via data from a single sensor or even from data of multiple sensors in a single electric utility service area.

Accordingly, certain embodiments of the new systems and methods can provide a timely, reliable, independent, comprehensive, and hyper-local view of electric power events, thereby enabling interested parties, including but not limited to public safety agencies, electric utilities, electric utility customers, and public and private situational awareness entities, to be timely notified of electric power events and make critical decisions on how to address the electric power events. Additionally, parties with an interest in historical electric power events may find the new systems and methods particularly useful. For example, an insurance adjuster investigating a power outage claim may use historical data from the new systems and methods to confirm occurrence of a past power outage at an insured's location. As another example, an electric utility may find historical data from the new systems and methods helpful when investigating a cause of a past power outage.

Moreover, particularly embodiments can provide electric power grid reliability data that is more sophisticated and informative than conventional electric power grid reliability data which is based on simple ratios of number of customers affected and length of outages. For example, some embodiments are capable of automatically generating a reliability index including the following features: (a) a defined minimum value and a defined maximum value, (b) non-linearity to help represent severity skew as reliability worsens, (c) a lookback period for considering historical data, (d) a recency bias such that data from more recent times in the lookback period is weighted more heavily than older data, and (e) ability to take into account electric power grid fluctuations.

FIG. 1 is a block diagram of a power event notification system 100, which is one embodiment of the new systems for power event notification disclosed herein. Power event notification system 100 includes a data receiving and aggregation subsystem 102, an identification subsystem 104, and a notification subsystem 106. The subsystems of power event notification system 100 are formed, for example, of analog and/or digital electronics. Additionally, in some embodiments, one or more of subsystems 102-106 are at least partially implemented by one or more processors (not shown) executing instructions, such as in the form of software and/or firmware, stored in one or more data stores (not shown), to perform the functions of subsystems 102-106. The one or more processors and data stores may be tangible elements, virtual elements, or a combination of tangible and virtual elements. In some embodiments, the one or more processors and data stores are implemented in a distributed computing environment, such as in a cloud computing environment. Although subsystems 102-106 are illustrated in FIG. 1 as being logically separate, two or more of subsystem 102-106 may be at least partially integrated. Additionally, subsystems 102-106 need not be co-located, and constituent elements of one or more of subsystems 102-106 could be distributed among multiple locations.

Data receiving and aggregation subsystem 102, henceforth referred to as "data subsystem" 102 for brevity, receives data sets $S_i(t)$ generated by respective sensors (not shown) at locations within an area served by an electric power grid (not shown). The letter i of the data sets is an index identifying a sensor that generated the data set $S_i(t)$, where i ranges from 1 to N, and N represents a quantity of sensors providing data sets $S_i(t)$ to system 100. Accordingly, data set $S_1(t)$ is generated by a first sensor, data set $S_2(t)$ is generated by a second sensor, and so on. Each data set $S_i(t)$ represents data at its respective sensor at a particular time, and each data set $S_i(t)$ includes metadata $M_i(t)$ and electric power data $E_i(t)$ generated by its respective sensor. Metadata $M_i(t)$ includes, for example, one or more of (a) location of the sensor generating the data set and (b) identification of the sensor identifying the data set. Electric power data $E_i(t)$ represents, for example, one or more parameters of the electric power grid at the location of the sensor generating the electric power data. Examples of such electric power grid parameters include, but are not limited, one or more of electric power grid voltage, electric power grid frequency, electric power grid current, and operating state of a power supply at the sensor, e.g., whether an inverter of a power supply is operating in a forward mode or a reverse mode.

In some embodiments, data subsystem 102 polls sensors to receive respective data sets $S_i(t)$ generated by the sensors. For example, data subsystem 102 may poll sensors on a periodic basis, such as every millisecond, every second, every minute, every five minutes, every ten minutes, every half hour, every hour, etc., to periodically obtain data sets $S_i(t)$ from each sensor. In some other embodiments, sensors push their respective data sets $S_i(t)$ to data subsystem 102, such as on a periodic basis and/or in response to change in sensor operating state. Sensors may provide their respective data sets $S_i(t)$ to data subsystem 102 in synchronicity, such that the respective data sets $S_i(t)$ from each sensor are synchronized in time. In some other embodiments, sensors provide their respective data sets $S_i(t)$ to data subsystem 102 in an asynchronous manner, such that the respective data sets $S_i(t)$ from each sensor are asynchronous.

The sensors generating data sets $S_i(t)$ are optionally out-of-band with respect to the electric power grid that they are monitoring, or in other words, the sensors are separate from the electric power grid that they are monitoring. As such, the sensors may provide an independent view of the electric power grid's operating state. In some embodiments, some or all of the sensors are incorporated within one or more communication networks. For example, in particular embodiments, each sensor is incorporated in a respective communication network node of one or more communication networks, where each communication network node is connected to, e.g., powered from, the electric grid. Examples of possible communication network nodes that sensors may be incorporated in include, but are not limited to, fiber nodes, wireless base stations (e.g., fourth generation (4G) cellular wireless base stations, fifth generation (5G) cellular wireless base station, sixth generation (6G) cellular wireless base stations, Wi-Fi wireless base stations, and satellite wireless base stations), optical network units (ONUs), optical network terminals (ONTs), telecommunications remote terminals (RT), telecommunications digital access line multiplexers (DSLAMs), and modems (e.g., cable modems, digital subscriber line (DSL) modems, and wireless modems). The sensors may advantageously use communication links of communication networks to transmit their respective data sets $S_i(t)$ to power event notification system 100, such that data sets $S_i(t)$ are generated and transmitted to system 100 independent of the electric power grid. In some embodiments, the communication network nodes have a backup electric power supply, e.g., from batteries, backup generators, solar power devices, wind power devices, flywheels, etc., such that the sensors can provide data sets $S_i(t)$ to power event notification system 100 even when the power grid is unable to provide reliable electric power at the communication network nodes.

Figure 2:
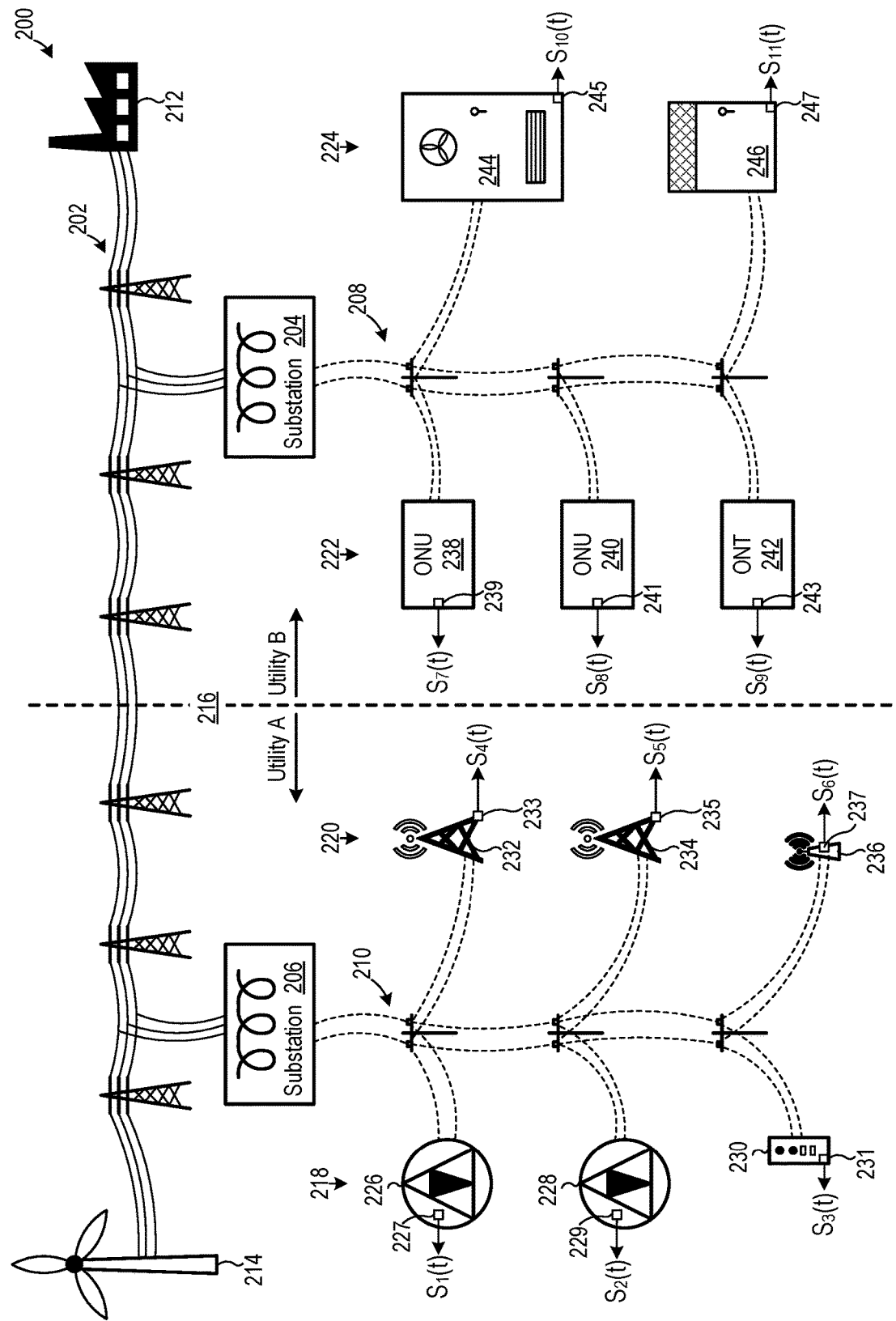
FIG. 2 is an illustration of an electric power grid that is monitored by sensors that are incorporated in communication network nodes, according to an embodiment.

FIG. 2 is an illustration of an electric power grid 200 that is monitored by sensors that are incorporated in communication network nodes, and the FIG. 2 illustration is one example of how sensors can be incorporated in communication network nodes to generate data sets $S_i(t)$. Electric power grid 200 includes electric transmission lines 202, a substation 204, a substation 206, electric distribution lines 208, electric distribution lines 210, a power plant 212, and a wind turbine generator 214. Transmission lines 202 carry electric power, such as generated by power plant 212 and wind turbine generator 214, to substations 204 and 206. Substation 204 electrically interfaces electric distribution lines 208 with electric transmission lines 202 by stepping down transmission line voltage to distribution line voltage (and by stepping up distribution line voltage to transmission line voltage). Substation 206 electrically interfaces electric distribution lines 210 with electric transmission lines 202 by stepping down transmission line voltage to distribution line voltage (and by stepping up distribution line voltage to transmission line voltage). Each of distribution lines 208 and 210 carries electric power to end users, such as homes (not shown), businesses (not shown), communication network nodes (discussed below), and other infrastructure (not shown). Although electric distribution lines 208 and 210 are depicted as being single phase electric distribution lines for illustrative simplicity, electric distribution lines 208 and 210 can (and usually will) be three phase electric distribution lines or a combination of three phase and single phase electric distribution lines.

In the FIG. 2 example, electric power grid 200 spans two electric utilities, i.e., electric utility A and electric utility B, which are separated by a dashed line 216 in FIG. 2. Dashed line 216 represents, for example, a geographic boundary between respective service areas of electric utilities A and B. Elements of electric power grid 200 to the left of line 216 belong to electric utility A, and elements of electric power grid 200 to the right of line 216 belong to electric utility B. The configuration of electric power grid 200 may vary without departing from the scope hereof. For example, electric power grid 200 may include additional electric transmission lines, substations, electric distribution lines, and/or electric power generation sources, without departing from the scope hereof. As another example, electric power grid 200 may span additional electric utilities, or electric power grid 200 may span only a single electric utility, without departing from the scope hereof.

FIG. 2 further illustrates communication networks 218, 220, 222, and 224 within the area served by electric power grid 200. Communication networks 218, 220, 222, and 224 are separate from, and therefore out of band with respect to, electric power grid 200. However, communication networks 218, 220, 222, and 224 may be (and usually will be) at least partially powered from electric power grid 200. FIG. 2 illustrates communication networks 218 and 220 being within the service area of electric utility A and communication networks 222 and 224 being within the service area of electric utility B. However, any of communication networks 218, 220, 222, and 224 could span the service areas of two or more electric utilities without departing from the scope hereof.

Communication network 218 is a cable communication network including communication network nodes in the form of a fiber node 226, a fiber node 228, and a cable modem 230. In some embodiments, communication network 218 operates according to a Data Over Cable Service Interface Specification (DOCSIS) data transmission protocol.

Communication network 218 will typically include additional elements, such as a cable modem termination system, optical cable, coaxial electrical cable, amplifiers, and/or taps, which are not shown for illustrative clarity. Each of fiber node 226, fiber node 228, and cable modem 230 is connected to, e.g., powered from, electric power grid 200 via electric distribution lines 210. Additionally, each of fiber node 226, fiber node 228, and cable modem 230 includes a respective sensor 227, 229, and 231 configured to generate a respective data set $S_1(t)$, $S_2(t)$, and $S_3(t)$.

Communication network 220 is a wireless communication network including communication network nodes in the form of a wireless base station 232, a wireless base station 234, and a wireless base station 236, operating in licensed and/or unlicensed radio frequency spectrum. Wireless base stations 232 and 234 are macro cells, and wireless base station 236 is a micro cell, pico cell, femto cell, or other small cell. Wireless base stations 232, 234, and 236 are, for example, 4G cellular wireless base stations, 5G wireless base stations, 6G wireless base stations, and/or Wi-Fi wireless base stations. Communication network 220 will typically include additional elements, such as a core network, back-haul communication links, mid-haul communication links, and/or front-haul communication links, which are not shown for illustrative clarity. Each wireless base station 232, 234, and 236 is connected to, e.g., powered from, electric power grid 200 via electric distribution lines 210. Additionally, each wireless base station 232, 234, and 236 includes a respective sensor 233, 235, and 237 configured to generate a respective data set $S_4(t)$, $S_5(t)$, and $S_6(t)$.

Communication network 222 is an optical communication network including communication network nodes in the form of an ONU 238, an ONU 240, and an ONT 242. In some embodiments, communication network 222 operates according to one or more of a passive optical network (EPON) data transmission protocol, radio frequency over glass (RFOG) data transmission protocol, and a gigabit passive optical network (GPON) data transmission protocol. Communication network 222 will typically include additional elements, such as an optical line terminal (OLT), optical cable, and/or optical splitters, which are not shown for illustrative clarity. Each of ONU 238, ONU 240, and ONT 242 is connected to, e.g., powered from, electric power grid 200 via electric distribution lines 208. Additionally, each of ONU 238, ONU 240, and ONT 242 includes a respective sensor 239, 241, and 243 configured to generate a respective data set $S_7(t)$, $S_8(t)$, and $S_9(t)$.

Communication network 224 is a telecommunications network including communication network nodes in the form of a RT 244 and a DSLAM 246. Communication network 224 will typically include additional elements, such as a telecommunications switch, optical cable, twisted pair electrical cable, and/or cross boxes, which are not shown for illustrative clarity. Each of RT 224 and DSLAM 246 is connected to, e.g., powered from, electric power grid 200 via electric distribution lines 208. Additionally, each of RT 244 and DSLAM 246 includes a respective sensor 245 and 247 configured to generate a respective data set $S_{10}(t)$ and $S_{11}(t)$.

As discussed above, each data set $S_i(t)$ includes metadata $M_i(t)$ and electric power data $E_i(t)$. Accordingly, each of data sets $S_1(t)$-$S_{11}(t)$ of FIG. 2 includes respective metadata $M_1(t)$-$M_{11}(t)$ and respective electric power data $E_1(t)$-$E_{11}(t)$. The metadata includes, for example, location (e.g., latitude and longitude) and identification of the communication network node generating the data set. The electric power data includes, for example, one or more of electric power grid 200 voltage at the communication network node generating the data set, electric power grid 200 frequency at the communication network node generating the data set, electric power grid 200 current at the communication network node generating the data set, and operating state of a power supply at the communication network node. It should be appreciated that the communication network nodes of FIG. 2 collectively generate electric power data $E_i(t)$ for grid 200 at numerous locations within grid 200, i.e., at the location of every communication network node including a sensor for generating a data set $S_i(t)$. Conventional electric utility SCADA equipment, in contrast, is typically installed only at key pieces of electric utility infrastructure and therefore cannot provide nearly the granularity in electric power data as sensors integrated in communication network nodes. It should also be appreciated that density of communication network nodes typically increases with increasing population density, and density of sensors within a given area will consequently also increase with increasing population density, assuming the sensors are deployed in most (or all) of the communication network nodes within the area. As a result, sensors within communication network nodes may inherently scale with population density. Additionally, it should be noted that the communication network nodes generating data sets $S_i(t)$ may span two or more electric utilities, e.g., electric utilities A and B of FIG. 2, such that the data sets collectively reflect a broad view of electric power grid operation over multiple electric utilities.

Furthermore, data sets $S_i(t)$ generated by the communication network nodes of FIG. 2 are out of band with respect to electric power grid 200 because communication networks 218, 220, 222, and 224 are separate from electric power grid 200. Consequently, data sets $S_i(t)$ generated by the communication network nodes provide an independent view of operation of electric power grid 200. Additionally, in some embodiments, communication networks 218, 220, 222, 224 include one or more backup electric power sources, such as respective backup electric power sources for each communication network node and/or backup electric power sources serving a plurality of communication network nodes. Accordingly, particular embodiments of communication networks 218, 220, 222, 224 are capable of providing data sets $S_i(t)$ even if electric power grid 200 is unable to provide reliable electric power to the communication networks.

Sensors incorporated with a communication node, e.g., sensors 227, 229, 231, 233, 235, 237, 239, 241, 243, 245, and 247 of FIG. 2, may be physical and/or virtual sensors dedicated to generating data sets $S_i(t)$. Alternately or additionally, the sensors may be implemented by physical and/or virtual subsystems within communication network nodes which perform additional functions. For example, in some embodiments, a communication network node sensor is at least partially embodied by a power supply of the communication network node including an inverter, one or more batteries, and voltage sensor. The voltage sensor measures power supply input voltage, i.e., power grid 200 voltage at the communication network node, and the inverter may operate in a forward mode or in a reverse mode. The forward mode indicates normal operation, i.e., that (a) the inverter is charging the one or more batteries from electric power grid 200 and (b) the communication network node is being powered from electric power grid 200. The reverse mode indicates that the communication network node is operating in a battery backup mode, such as due to a power outage at the location of the communication network node. In the reverse mode, the inverter powers the communication network node from the one or more batteries of the power supply. In these embodiments, the power supply generates electric power data $E_i(t)$ representing at least power supply voltage and inverter status.

Additional examples of communication network nodes generating electric power data may be found in (a) U.S. Pat. No. 11,108,268 to Caruso et al. and (b) U.S. patent application Ser. No. 17/337,275 filed on Jun. 2, 2021, each of which is incorporated herein by reference.

Referring again to FIG. 1, data subsystem 102 is further configured to aggregate received data sets $S_i(t)$, such as data sets $S_1(t)$-$S_{11}(t)$ generated by the communication network nodes of FIG. 2. Such aggregation may include organizing and/or sorting the data sets according to one or more predetermined criteria, such as by location of respective sensors generating the data sets $S_i(t)$ and/or time that the data sets were generated. Some embodiments of data subsystem 102 are configured to assign each received data set $S_i(t)$ to an appropriate cell of a map of an electric power grid, according to the location of the sensor generating the data set. In some embodiments, the map includes a USNG projection system, and data subsystem 102 is configured to map each received data sets $S_i(t)$ to an appropriate cell of the USNG projection system, according to the location of the sensor that generated the data set $S_i(t)$.

Figure 3:
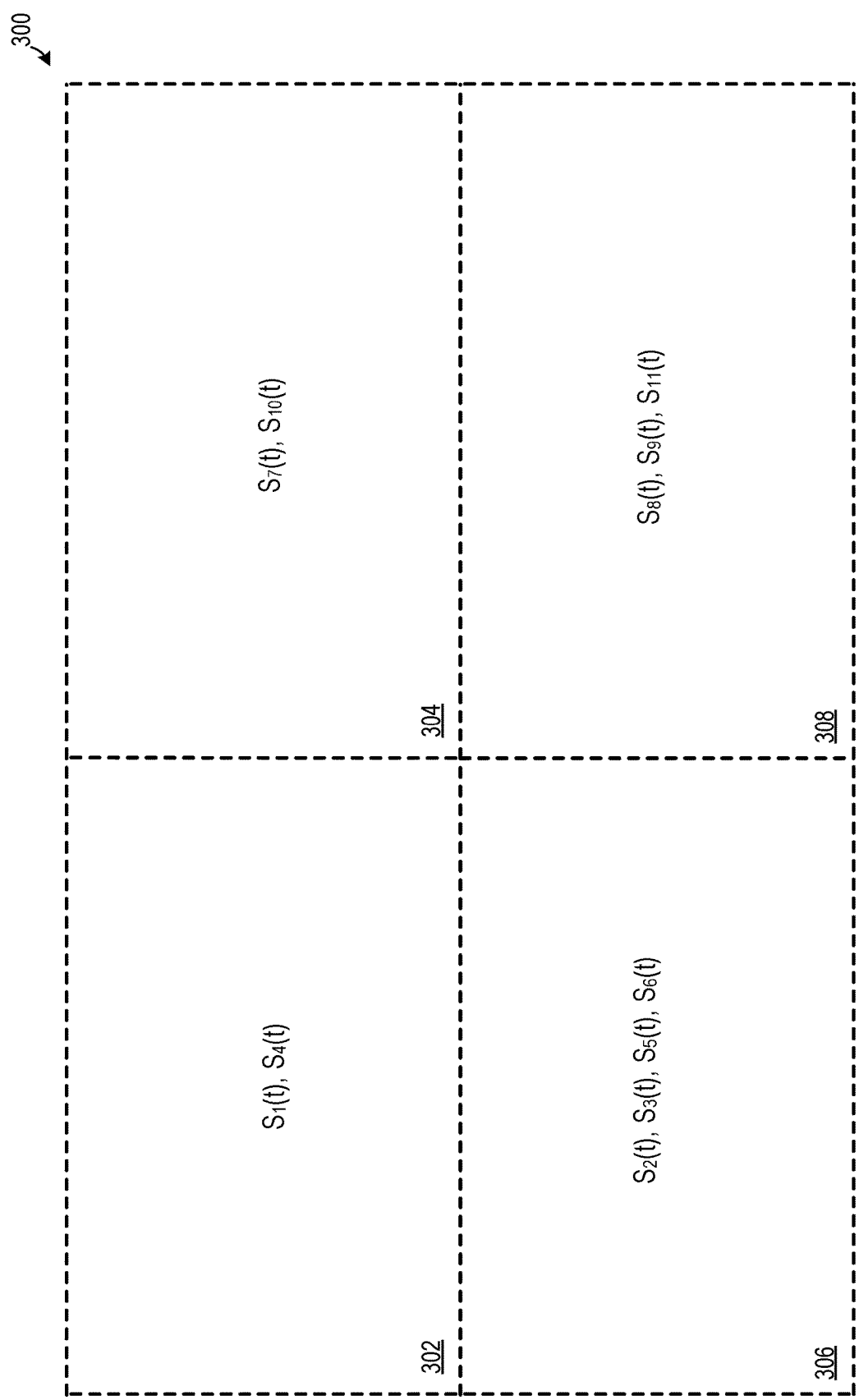
FIG. 3 illustrates an example of data set assignment to a map of an electric power grid.

For example, FIG. 3 illustrates one possible assignment of the FIG. 2 data sets to a map of electric power grid 200. In this example, the service area of electric power grid 200 is represented by a map 300 including cells 302, 304, 306, and 308. In some embodiments, each cell 302-306 is a cell of the USNG projection system. The quantity, size, and shapes of cells in map 300 may vary. Communication network nodes 226 and 232 are located within cell 302, and data system 102 therefore assigns their respective data sets $S_1(t)$ and $S_4(t)$ to cell 302. Communication network nodes 238 and 244 are located within cell 304, and data system 102 therefore assigns their respective data sets $S_7(t)$ and $S_{10}(t)$ to cell 304. Each of communication network nodes 228, 230, 234, and 236, in turn, is located within cell 306, and data system 102 therefore assigns their respective data sets $S_2(t)$, $S_3(t)$, $S_5(t)$, and $S_6(t)$ to cell 306. Finally, communication nodes 240, 242, and 246 are located within cell 308, and data system 102 therefore assigns their respective data sets $S_8(t)$, $S_9(t)$, and $S_{11}(t)$ to cell 308.

Assigning data sets to specific map cells, such as illustrated in FIG. 3, may be leveraged to obscure the location and type of communication network nodes generating the data sets, such as to protect communication network security and/or communication network trade secrets. For example, locations associated with data sets $S_i(t)$ generated by the communication networks nodes of FIG. 2 may be specified by map cell, instead of by exact location of the communication network nodes generating the data sets, to maintain confidentiality of communication network node locations. Nevertheless, data set location granularity may be relatively high if map cells are sufficiently small. For example, USNG projection system cells may be one kilometer by one kilometer, and classifying data set location by USNG projection system cell may therefore provide one kilometer by one kilometer granularity, which is much higher than county or state level granularity of conventional power outage notification systems.

Referring again to FIG. 1, data subsystem 102 provides aggregated data sets 108 to identification subsystem 104, and identification subsystem 104 is configured to identify, from at least one of the data sets, occurrence of an electric power event in an electric power grid, e.g., electric power grid 200 of FIG. 2. Identification subsystem 104 identifies an electric power event, for example, from a change in operating state of one or more sensors, as indicated by their respective data sets $S_i(t)$. For instance, in some embodiments, identification subsystem 104 determines, for each sensor providing a respective data set $S_i(t)$, an operating state of the sensor based on electric power data $E_i(t)$ of the sensor's data set. Identification subsystem 104 determines sensor operating state, for example, on a periodic basis or whenever aggregated data sets 108 include a new data $S_i(t)$ for a sensor. Possible sensor operating states are implementation dependent, but each sensor will typically have at least two possible operating states, where at least one operating state indicates normal operation of an electric power grid being monitored by the sensor, and least one other operating state indicates abnormal operation of the electric power grid being monitored by the sensor.

Discussed below are several example operating states of sensors 227, 229, 231, 233, 235, 237, 239, 241, 243, 245, and 247 of FIG. 2, as determined by identification subsystem 104. It is understood, however, that identification subsystem 104 could be configured to determine fewer, additional, or alternative sensor operating states.

Normal State

Identification subsystem 104 determines that a sensor is operating in a normal state in response to the sensor's electric power data $E_i(t)$ being normal, e.g., within a predetermined range of normal values. For example, in embodiments where the sensor's electric power data $E_i(t)$ includes magnitude of power supply input voltage and inverter status, identification subsystem 104 may determine that the sensor is operating in its normal state in response to (a) the power supply input voltage being within a predetermined tolerance range of nominal power supply input voltage and (b) the inverter operating in a forward mode. The predetermined tolerance range is implementation dependent, but in some embodiments, it is plus or minus five percent, or plus or minus ten percent, of the nominal power supply input voltage.

Power-Off State

Identification subsystem 104 determines that a sensor is operating in a power-off state in response to the sensor's electric power data $E_i(t)$ indicating that electric power grid 200 is not supplying electric power at the location of the communication network node incorporating the sensor. For example, in embodiment where the sensor's electric power data $E_i(t)$ includes magnitude of power supply input voltage, identification subsystem 104 may determine that the sensor is operating in its power-off state in response to the power supply input voltage being zero volts or nearly zero volts.

Generator State

Identification subsystem 104 determines that a sensor is operating in a generator state in response to the sensor's electric power data $E_i(t)$ indicating that the communication network node is being powered from an external electric power source other than electric power grid 200. For example, identification subsystem 104 may determine that the sensor is operating in its generator state in response to the sensor's electric power data $E_i(t)$ indicating that the communication network node incorporating the sensor is being powered from an external generator, such as a fossil fuel powered generator, a solar generator, a wind generator, etc.

Low-Voltage State

Identification subsystem 104 determines that a sensor is operating in a low-voltage state in response to the sensor's electric power data $E_i(t)$ indicating that electric power grid 200 voltage at the location of the communication network node incorporating the sensor is below a predetermined tolerance range of nominal power supply input voltage but at least a minimum threshold value for powering the communication network node. For example, in embodiments where the sensor is incorporated within a fiber node of a cable communication network, identification subsystem 104 may determine that the sensor is operating in its low-voltage state in response to the sensor's electric power data $E_i(t)$ indicating that the voltage of electric power grid at the fiber node is at least 90 volts but is below 95 percent of a nominal power supply input voltage.

High-Voltage State

Identification subsystem 104 determines that a sensor is operating in a high-voltage state in response to the sensor's electric power data $E_i(t)$ indicating that electric power grid 200 voltage at the location of the communication network node incorporating the sensor is above a predetermined tolerance range of nominal power supply input voltage. For example, identification subsystem 104 may determine that the sensor is operating in its high-voltage state in response to the sensor's electric power data $E_i(t)$ indicating that the voltage of electric power grid at the communication network node is greater than 105 percent, or is greater than 110 percent, of a nominal power supply input voltage.

Safety State

Identification subsystem 104 determines that a sensor is operating in a safety state in response to the sensor's electric power data $E_i(t)$ indicating that electric power grid 200 voltage at the location of the communication network node incorporating the sensor is above zero but is below a minimum threshold value for powering the communication network node. For example, in embodiments where the sensor is incorporated within a fiber node of a cable communication network, identification subsystem 104 may determine that the sensor is operating in its safety state in response to the sensor's electric power data $E_i(t)$ indicating that the voltage of the electric power grid at the fiber node is greater than zero but it less than 90 volts. The communication network node incorporating the sensor will typically be operating from backup power in the safety state. For example, in embodiments where a communication network node includes an inverter and one or more batteries, the inverter may be operating in the reverse mode in the safety state, such that the inverter is powering the communication network node from energy stored in the one or more batteries.

Unknown State

Identification subsystem 104 determines that a sensor is operating in an unknown state in response identification subsystem 104 being unable to determine operating state of electric power grid 200 at the location of the communication network node incorporating the sensor. For example, identification subsystem 104 may determine that the sensor is operating in its unknown state in response to failure to receive the sensor's electric power data $E_i(t)$ for at least a predetermined amount of time.

Communication Failure State

Identification subsystem 104 determines that a sensor is operating in a communication failure state in response identification subsystem 104 being unable to receive the sensor's respective data set $S_i(t)$ due to a communication network failure. Identification subsystem 104 may be automatically apprised of the communication network failure, for example, by receiving a signal from the communication network indicating the failure, or from lack of receipt of an expected signal from the communication network. In some embodiments, the communication failure state includes the following two substates:

(a) Prior power-off substate: this substate indicates that there was a power outage at the location of the communication network node incorporating the sensor before the communication failure state. In some embodiments, identification subsystem 104 is configured to determine that communication network backup power has been depleted in response to the combination of the communication failure state and the prior power-off substate.

(b) Prior power-on substate: this substate indicates that there was power at the location of the communication network node incorporating the sensor before the communication failure state. In some embodiments, identification subsystem 104 is configured to determine that there is communication network issue in response to the combination of the communication failure state and the prior power-on substate.

Dead Battery State

Identification subsystem 104 determines that a sensor is operating in a dead battery state in response to the sensor's electric power data $E_i(t)$ indicating that a backup battery of the communication network node incorporating the sensor is dead or has a charge that is below a minimum threshold value. The backup battery may be dead, for example, due to the battery being discharged or due to a defect in the battery and/or a defect in associated charging/discharging circuitry.

Figure 4:
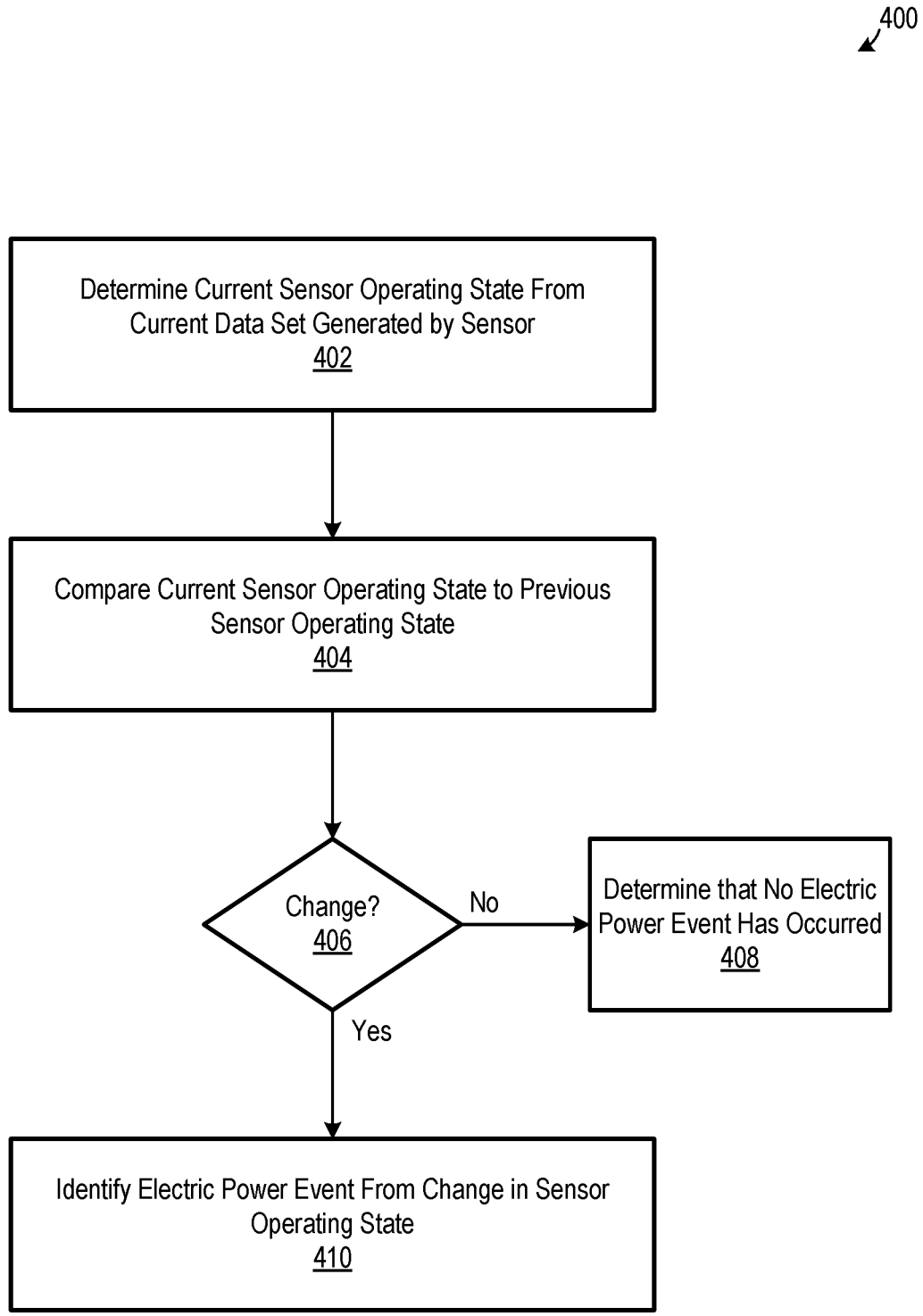
FIG. 4 is a flow chart of a method for identifying occurrence of an electric power event in an electric power grid, according to an embodiment.

FIG. 4 is a flow chart of a method 400 for identifying occurrence of an electric power event in an electric power grid. Method 400 is implemented, for example, by some embodiments of identification subsystem 104 for each sensor generating data sets $S_i(t)$, e.g., for each of sensors 227, 229, 231, 233, 235, 237, 239, 241, 243, 245, and 247 of FIG. 2. Identification subsystem 104 may perform method 400 from time to time, for example, on a periodic basis or whenever a new data set $S_i(t)$ is received for a given sensor.

In a block 402 of method 400, identification subsystem 104 determines a current sensor operating state from a current data set $S_i(t)$ generated by the sensor. For example, identification subsystem 104 may determine that the sensor is currently operating in one of the normal state, the power-off state, the generator state, the low-voltage state, the high-voltage state, the safety state, the unknown state, the communication failure state, and the dead battery state. In a block 404 of method 400, identification subsystem 104 compares the current operating state determined in block 402 to a most-recent previously determined operating state of the sensor. Decision block 406 determines, from the comparison of block 404, whether there has been a change in operating state of the sensor. If no, method 400 proceeds to block 408 where identification subsystem 104 determines that no electric power event has occurred at the sensor. On the other hand, if the result of decision block 406 is yes, method 400 proceeds to block 410 and identifies occurrence of an electric power event from a change in sensor operating state. In some embodiments, identification subsystem 104 identifies electric power event occurrence solely from a change in state of a single sensor. For example, assume that the sensor changes from the normal state to the power-off state. Some embodiments of identification subsystem 104 would identify occurrence of a power outage solely from this change in sensor operating state. Some other embodiments, however, identify occurrence of an electric power event by considering one or more additional factors, such as by analyzing data sets $S_i(t)$ in space and time to identify an electric power event.

In particular, an electric power event may affect multiple sensors, as well as the particular sensor being considered in an instance of the FIG. 4 method. If there are multiple sensors, the sensors participating in the electric power event may be either contiguous or non-contiguous. Contiguous sensors are sensors within respective geographic areas, e.g., within respective cells in the FIG. 3 map, that border each other. Some embodiments of identification subsystem 104 are configured to identify an electric power event affecting multiple sensors, as well as electric power event affecting a single sensor.

Figure 5:
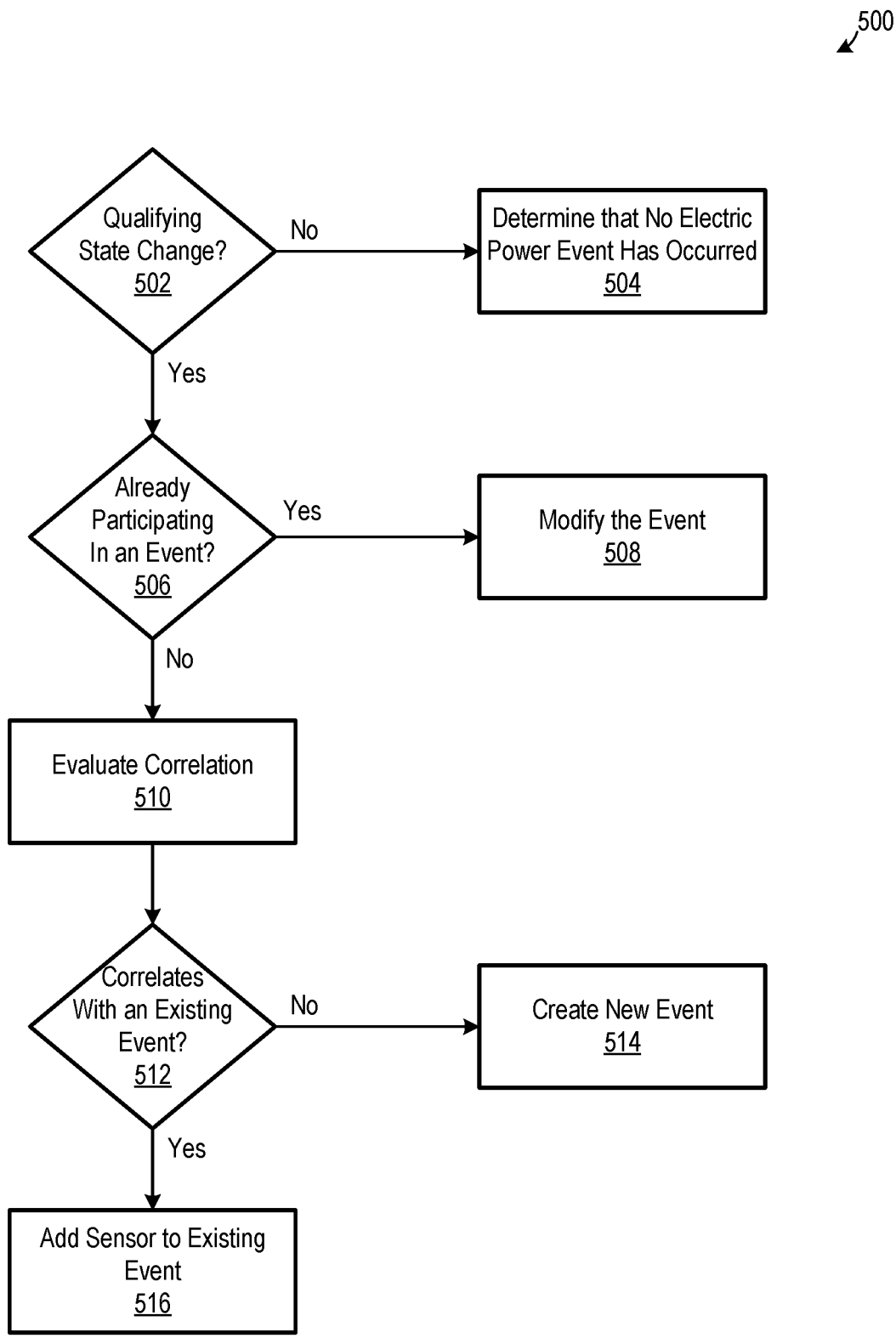
FIG. 5 is a flow chart of a method for identifying an electric power event from a change in sensor operating state, according to an embodiment.

FIG. 5 is a flow chart of a method 500 for identifying an electric power event from a change in sensor operating state. Method 500 is one possible embodiment of block 410 of method 400 of FIG. 4. In a decision block 502, identification subsystem 104 determines whether the sensor state change is a qualifying state change, i.e., whether the sensor state change indicates occurrence of an electric power event. For example, in some embodiments, a change to the normal state, the power-off state, the generator state, the low-voltage state, the high-voltage state, the safety state, the unknown state, or the communication failure/prior power off state is a qualifying state change, while a change to the dead battery state or the communication failure/prior power-on state are not qualifying state changes because they do not indicate an electric power grid issue. If the result of decision block 502 is no, method proceeds to block 504 where identification subsystem 104 determines that no electric power event has occurred. If the result of decision block 502 is yes, method proceeds to decision block 506.

In decision block 506, identification subsystem 104 determines whether the sensor with the state change is already participating in an electric power event. If the result of decision step 506 is yes, method 500 proceeds to block 508, where identification subsystem 104 modifies the event in response to the sensor's state change. For example, assume that the sensor was previously part of a power outage event, and the sensor's state changed from the power-off state to the normal state. Identification subsystem 104 would accordingly modify the power outage event to no longer include the sensor, or the sensor's corresponding map cell, because the sensor is now operating in the normal state. As another example, assume that the sensor was previously part of a power outage event, and the sensor's state changed from power-off state to the communication failure state. Identification subsystem 104 would cause the sensor to remain in the power outage event, but identification subsystem 104 modify the event history to record the sensor state change.

If the result of decision block 506 is no, method 500 proceeds to block 510. In block 510, identification subsystem 104 evaluates correlation between the sensor's state change and one or more existing electric power events, as discussed further below. In decision block 512, identification subsystem 104 then determines from the correlation evaluation of block 510 whether the sensor's state change correlates with an existing electric power event. If the result of decision block 512 is no, method 500 proceeds to block 514 where identification subsystem 104 creates a new electric power event in response to the sensor's state change. For example, assume that the sensor's state change indicates a power outage, but the state change did not correlate with any existing power outage. Identification subsystem 104 would therefore create a new power outage event in block 514. If the result of decision block 512 is yes, identification subsystem 104 adds the sensor to the existing electric power event in block 516.

Figures 6, 7:
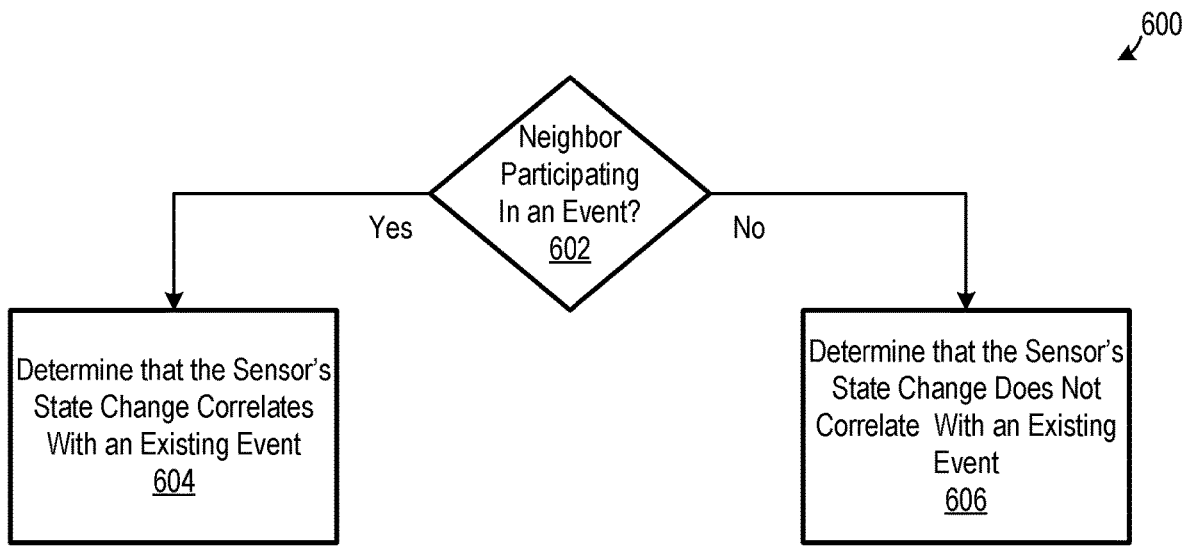
FIG. 6 is a flow chart of a method for evaluating a correlation between a sensor's state change and an existing electric power event, according to an embodiment.
FIG. 7 illustrates an example data structure corresponding to an electric power event, according to an embodiment.

Referring again to block 510, in some embodiments, identification subsystem 104 considers time and/or geographic correlation when evaluating correlation between the sensor's state change and one or more existing electric power events. Discussed below with respect to FIG. 6 is one example of how identification subsystem 104 may evaluate correlation in block 510. However, identification subsystem 104 is not limited to evaluating correlation according to this example.

FIG. 6 is a flow chart of a method 600 for evaluating a correlation between a sensor's state change and an existing electric power event. Method 600 is one possible embodiment of block 510 of FIG. 5. In a decision block 602 of method 600, identification subsystem 104 determines whether one or more nearest neighboring sensors are participating in an event. In some embodiments, such as when considering all available sensors when performing method 600, nearest neighboring sensors are sensors in all adjacent cells of a power grid map, such as a USNG projection system map. If two or more nearest neighboring cells are participating in different electric power events, identification subsystem 104 optionally selects one of the events of the neighboring cells according to a predetermined priority scheme. For example, assume that one neighboring cell is participating in a low-voltage event while another neighboring cell is participating in a power outage event. Identification subsystem 104 may select the power outage event as the neighboring sensor event in decision step 602, because the power outage event is considered a higher priority event, e.g., a more serious event, than a low-voltage event. If a neighboring cell does not include a sensor, identification subsystem 104 may disregard the cell, or identification subsystem 104 may infer the cell's status from one or more adjacent cells.

As one example of decision block 602, assume that the sensor under consideration changed from the normal state to the power-off state, which indicates a power outage. If a nearest neighboring sensor is also participating in a power outage, the result of decision block 602 would be yes, and if nearest neighboring sensor is not participating in a power outage, then the result of decision block 602 would be no.

If the result of decision block 602 is yes, method 600 proceeds to block 604 where identification subsystem 104 determines that the sensor's state change correlates with an existing electric power event. If the result of decision block 602 is no, method 600 proceeds to block 606 where identification subsystem 104 determines that the sensor's state change does not correlate with an existing electric power event. In some embodiments, applicability of method 600 is limited to certain sensor state changes, such as from the normal state to the power-off state, or from the normal state to the low-voltage state.

Electric power event correlation evaluation performed by identification subsystem 104, e.g., in block 510, may consider all available sensors, e.g., all available sensors in a given electric power grid or even all available sensors of a plurality of power grids. Alternately, identification subsystem 104 may consider only a subset of available sensors, such as available sensors in a particular area of interest, e.g., within a specified distance of a location of interest, when performing electric power event correlation.

If should be noted that system 100's ability to collect and analyze data sets $S_i(t)$ from sensors over a large area, e.g., from sensors over an entire electric power grid, may enable the system to provide valuable insight to an electric power event that would not be possible with a system that collects only regional electric power grid data. For example, consider a malicious attack on an electric power grid that causes net load on the electric power grid to cycle between extreme conditions. Such attack may not be evident from data representing only a portion of the electric power grid, such as from data representing only a particular electric utility's service area. However, the attack may be evident when considering data from the entire electric power grid.

Referring again to FIG. 1, some embodiments of identification subsystem 104 are configured to create a respective event structure 110 for each identified electric power event. Each event structure 100 includes, for example, an unique identifier for the event structure, the electric power event's starting date and time, the electric power event's ending date and time, and a list of sensors (or corresponding map cells) participating in the event. The unique identifier specifies, for example, (a) date and time when the corresponding electric power event was first identified, and (b) location, such as sensor location or map cell identity, where the event was first identified. Each event structure 110 optionally further includes information indicating when each sensor participating in the event joined the event and when each sensor left the event, as well as information indicating each sensor's state before the event, during the event, and/or after the event.

An event structure 110 may include further information, such electric power event magnitude or scope, electric power event duration, and/or electric power event classification. Identification subsystem 104 determines electric power event magnitude or scope, for example, as function of quantity of sensors or map cells that participated in the event and/or are currently participating in the event. Identification subsystem 104 determines electric power event duration, for example, from a difference between event ending time and event starting time (if the event is no longer ongoing), or from a difference between current time and event starting time (if the event is ongoing). Identification subsystem 104 determines electric power event classification, for example, based on event duration and/or number of sensors, or number of map cells, participating in the event. For example, an electric power event may be classified as a "short" event if its duration is less than four hours, and the electric power event may be classified as a "long" event if its duration is greater than or equal to four hours. As another example, an electric power event may be classified as (a) "hyper-local" if only one sensor, or only one map cell, participates in the event, (b) "local" if two sensors or map cells participate in the event, or (c) "large" if three or more sensors or map cells participate in the event.

Identification subsystem 104 may modify an event structure 110 as its corresponding electric power event evolves, such as due to a participating sensor changing operating state. In some embodiments, if a sensor is no longer participating the electric power event, the sensor remains on a list of participating sensors in the event structure, but an end time of the sensor's participation is populated in the list. Additionally, in certain embodiments, if a sensor is no longer participating in the event but subsequently rejoins the event, the sensor is added to the list as a new entry. Accordingly, in particular embodiments, a sensor may have multiple entries in an event structure, but only one of the entries may be active at a given time.

Identification subsystem 104 is optionally configured to store event structures 110 corresponding to non-active electric power events for future access, such as to provide information on historical electric power events. In some embodiments, event structures 110 corresponding to active electric power events are store in memory while event structures 110 corresponding to non-active events are stored in a database.

FIG. 7 illustrates an event structure 700, which is one example of an event structure 110 created by identification subsystem 104. Event structure 700 includes the following fields: (a) event structure unique identifier 702, (b) electric power event starting time 704, (c) electric power event ending time 706, (d) electric power event magnitude 708, (e) electric power event duration 710, (f) event classification 712, (g) participating sensors 714, (g) sensor starting time 716, and (h) sensor ending time 718. Not all fields of event structure 700 will necessarily be populated at a given time, especially in the corresponding electric power event is ongoing. FIG. 7 illustrates an example where sensors 2, 5, and 9 joined the electric power event at date/times A, B, and C, respectively. In this example, sensor 2 left the event at date/time E, and sensor 5 left the event and date/time G. Sensor 9 is still participating in the event at the time of the FIG. 7 illustration. Additionally, sensor 2 rejoined the event at time F and is still participating in the event at the time of the FIG. 7 illustration. Event structure 700 could be modified to include a different number of fields, as well as to store different information in its fields, without departing from the scope hereof.

Some embodiments of identification subsystem 104 are configured to determine a confidence metric for each sensor. Identification subsystem 104 determines the confidence metrics, for example, from historical electric power event information, such as from historical event structures stored in a database. In one embodiment, the confidence metric for each sensor ranges from zero to one, where zero indicates no confidence in the sensor's data and one indicates complete confidence in the sensor's data.

Referring again to FIG. 1, identification subsystem 104 is configured to provide event information 112 to notification subsystem 106. Event information 112 includes, for example, (a) information on events identified by notification subsystem 104 and/or (b) sensor, or corresponding map cell, operating state. Notification subsystem 106 is configured to generate a notification 114 of electric power events identified by identification subsystem 104, at least partially from event information 112. Generating notification 114 includes, for example, one or more (a) sending an electronic mail message and/or a text message reporting an electric power event and/or or other information related to electric power grid status, (b) providing information representing an electric power event, and/or other information related to electric power grid status, to an application programming interface (API), and (c) providing information representing an electric power event, and/or other information related to electric power grid status, to a geographic information system (GIS). Below are several specific examples of notification 114. It is understood, however, that notification 114 is not limited to these examples.

Daily Summary Report

Some embodiments of notification subsystem 104 are configured to generate a notification 114 in the form of a daily summary report. Notification subsystem 104 provides the daily summary report to an external system or another party, for example, by including the daily summary report in an electronic mail or text message, by making the daily summary report available to an API, and/or providing the daily summary support to a GIS. The daily summary report may be generated once per day, and each recipient may specify a preferred time zone and geographic coverage area. The daily summary report may summarize all electric power events that were active for at least part of the summary period, e.g., between midnight of one day and midnight of the next day. In some embodiments, the daily summary report includes one or more of the following items for each electric power event that was active for at least part of the summary period: (a) an event identifier, e.g., the same identifier as used in a corresponding event structure, (b) event location, (c) event start date and start time in the preferred time zone, (d) event end date and end time, if available, in the preferred time zone, (e) current event magnitude, (f) minimum event magnitude and corresponding time stamp throughout the event's life, (g) maximum event magnitude and corresponding time stamp throughout the event's life, and (h) event impact, e.g., population affected and identification of critical elements, such as power vulnerable population, buildings, and infrastructure, that may be affected by the event.

Event Notification Report

Some embodiments of notification subsystem 104 are configured to generate a notification 114 in the form of an event notification report, such as in response to an electric power event be identified, an electric power event be completed, and/or change in an electric power event's magnitude. In some embodiments, at least one of the following report parameters are configurable by each recipient: (a) preferred time zone, (b) preferred geographic area, (c) minimum event magnitude to trigger a notification report, e.g., only send a notification report in response to occurrence of large events, and (d) quantity of events to be included in each event report. In particular embodiments, each event notification report includes one or more of the following items: (a) event identifier, e.g., the same identifier as used in a corresponding event structure, (b) event location, (c) event start date and start time in the preferred time zone, (d) event end date and end time, if available, in the preferred time zone, (e) current event magnitude, (f) minimum event magnitude and corresponding time stamp throughout the event's life, (g) maximum event magnitude and corresponding time stamp throughout the event's life, and (h) event impact, e.g., population affected and identification of critical elements, such as power vulnerable population, buildings, and infrastructure, that may be affected by the event.

Figure 8:
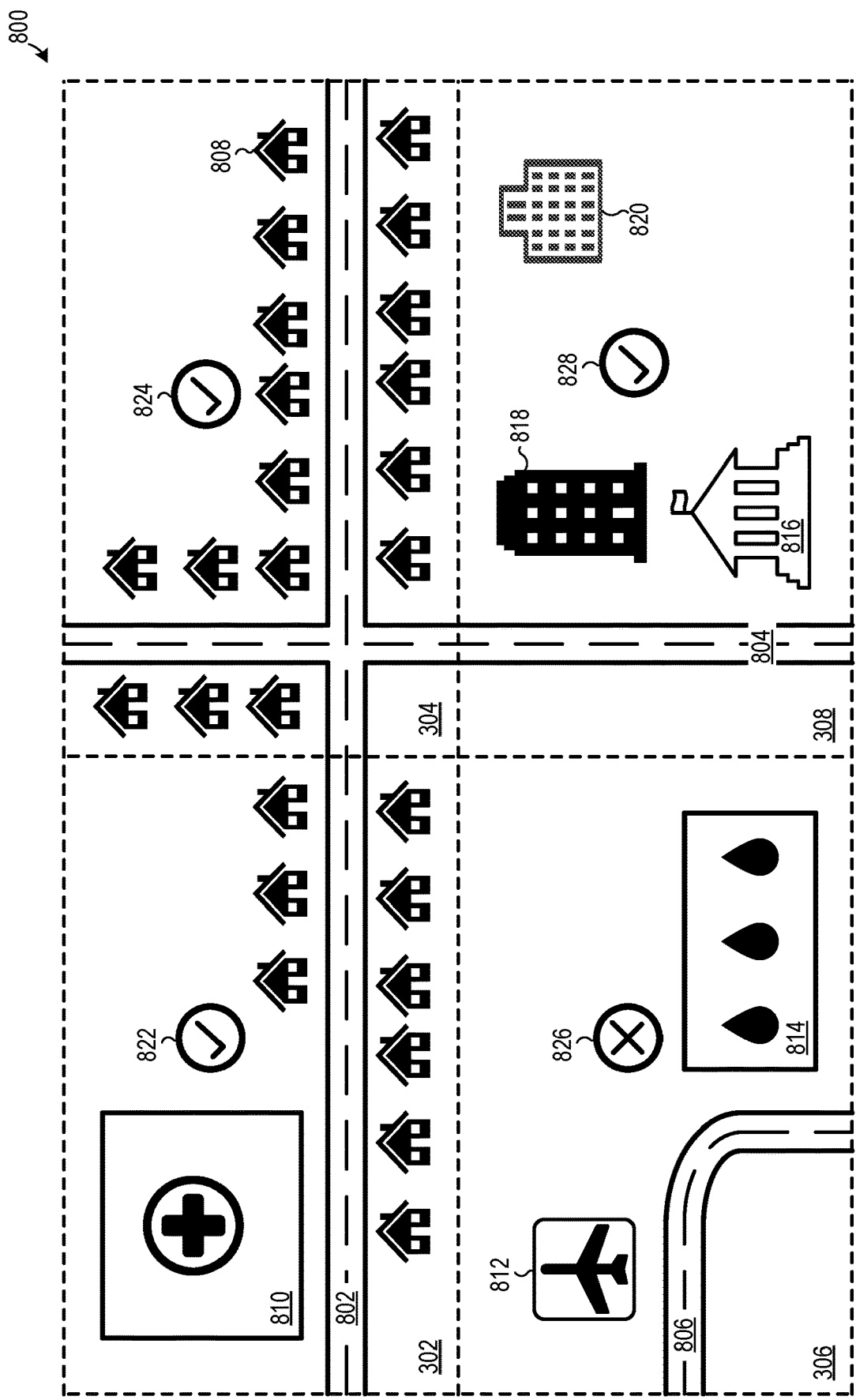
FIG. 8 illustrates a geographic information system map with electric power event notification information overlaid thereon, according to an embodiment.

FIG. 8 is an illustration of one example of how electric power event information could be provided to a GIS and overlaid on a map 800 generated by the GIS. Map 800 includes the same cells as map 300 of FIG. 3, i.e., cells 302, 304, 306, and 308. Additionally, map 800 includes one or more GIS layers illustrating the following features: roads 802, 804, and 806, houses 808 (only one is labeled), medical facility 810, airport 812, freshwater treatment plant 814, school 816, office building 818, and nursing home 820. Additionally, each of cells 302, 304, 306, and 308 includes a respective electric grid status indicator 822, 824, 826, 828. Each status indicator 822, 824, 826, 828 indicates electric power grid status within its respective map cell, based on notifications 114 generated by notification subsystem 106. In this example, a status indicator including a check mark indicates no reported electric power events within its correspond cell, while a status indicator including an "X" indicates reported occurrence of at least one electric power event within the corresponding cell. Accordingly, there are no reported electric power events within cells 302, 304, and 308, but at least one electric power event, e.g., a power outage, has been reported within cell 306.

It should be appreciated that the overlay of electric power event notification on GIS layers in map 800 may be helpful in evaluating impact of a power outage or other electric power event, such as by type of electric power customers affected as well as geographic scope of the power outage or other electric power event. For example, cell 306 includes airport 812 and freshwater treatment plant 814, both of which are critical infrastructure. Consequently, one may determine from map 800 that the electric power event in cell 306 has potential for significant negative impact due to critical infrastructure being located within cell 306. Additionally, hospital 810, school 816, and nursing home 820 are critical buildings, and map 800 is advantageously capable of providing notification of electrical power events in respective cells 302 and 308, should they occur. Some embodiments are further capable of providing information on buildings and/or other infrastructure displayed on map 800, such as a description of the buildings and infrastructure and/or contact information for people associated with the buildings and infrastructure. For example, some embodiments of map 800 may indicate that freshwater treatment plant 814 provides drinking water for a metropolitan area, thereby helping apprise an electric utility or public safety agency of the great significance of an electric power outage in cell 306. As another example, map 800 may provide contact information for a manager of airport 812, thereby enabling a public safety agency to contact the airport manager to discuss need for resources to mitigate effects of a power outage.

Reliability Index

As discussed above, conventional electric power grid reliability metrics are based on simple ratios, such as number of customers affected by electric power outages and lengths of such outages. Power event notification system 100, however, is capable of providing information that enables determination of additional metrics for evaluating electric power grid reliability. Accordingly, some alternate embodiments of power notification system 100 are further capable of automatically generating a reliability index that is more sophisticated and informative than conventional electric grid reliability metrics.

Figure 9:
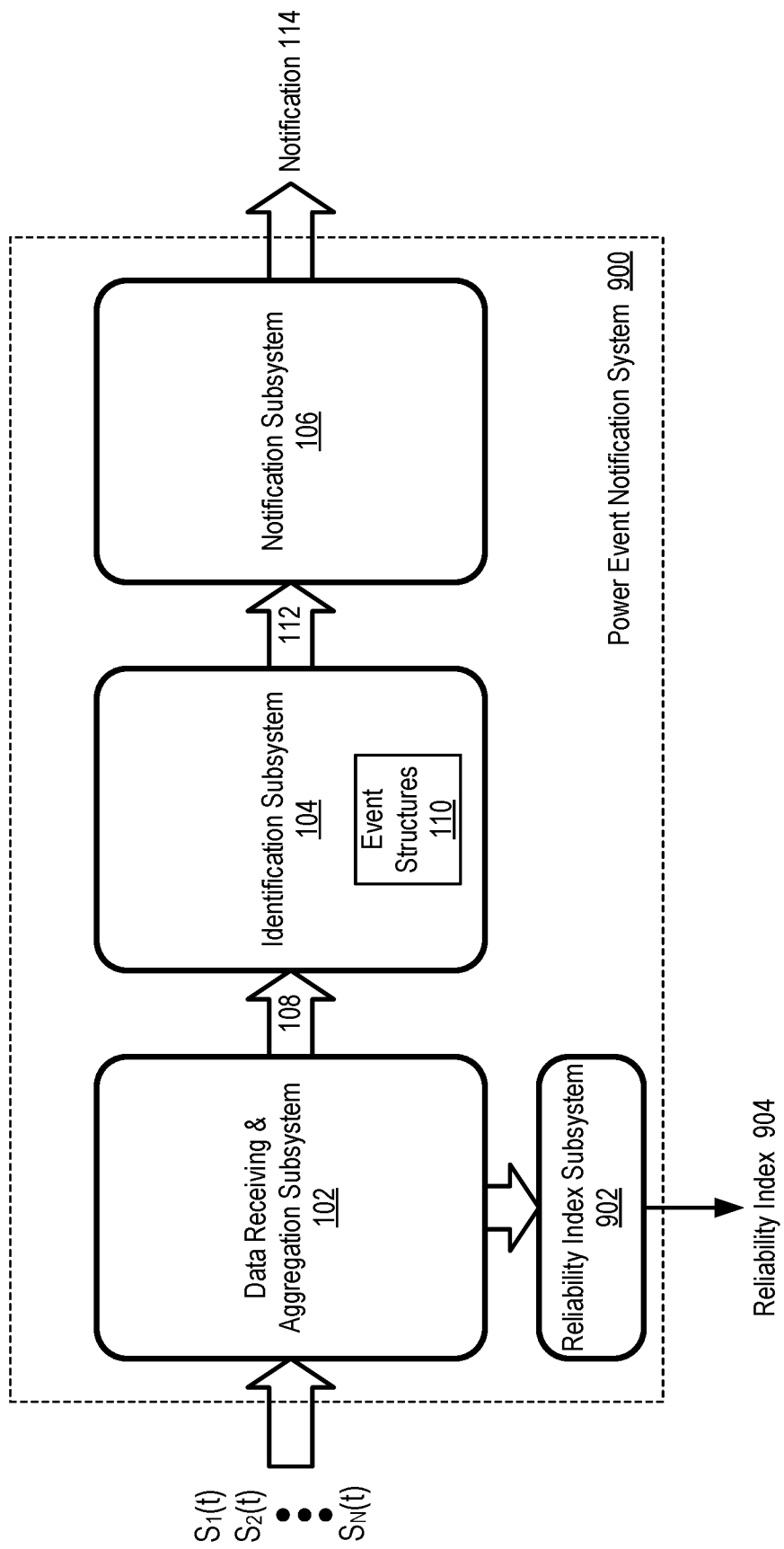
FIG. 9 is a block diagram of an alternate embodiment of the FIG. 1 power event notification system further including a reliability index subsystem, according to an embodiment

For example, FIG. 9 is a block diagram of a power event notification system 900, which is an alternate embodiment of system 100 of FIG. 1 which further includes a reliability index subsystem 902. Reliability index subsystem 902 is formed, for example, of analog and/or digital electronics. Additionally, in some embodiments, reliability index subsystem 902 is at least partially implemented by one or more processors (not shown) executing instructions, such as in the form of software and/or firmware, stored in one or more data stores (not shown), to perform the functions of subsystem 902. The one or more processors and data stores may be tangible elements, virtual elements, or a combination of tangible and virtual elements. In some embodiments, the one or more processors and data stores are implemented in a distributed computing environment, such as in a cloud computing environment. Although subsystems 102-106 and 902 are illustrated in FIG. 9 as being logically separate, two or more of subsystem 102-106 and 902 may be at least partially integrated. Additionally, subsystems 102-106 and 902 need not be co-located, and constituent elements of one or more of subsystems 102-106 and 902 could be distributed among multiple locations.

Reliability index subsystem 902 is configured to determine a reliability index 904 at least partially based on data sets $S_i(t)$ from data subsystem 102, such as from electric power grid voltage measurements included data sets $S_i(t)$. In some embodiments, reliability index subsystem 902 determines reliability index 904 at least partially based on a recency-biased conjugate prior probability distribution of voltages of the electric power grid being in compliance with a reference voltage. Discussed below are several examples of how reliability index subsystem 902 may determine reliability index 904, although it is understood that subsystem 902 is not limited to these examples.

In certain embodiments, data sets $S_i(t)$ include a time series of voltages, $[V_0, \ldots, V_n]$ sampled at times $[t_1, \ldots, t_n]$ in an electric power grid. For example, the time series of voltages $[V_0 \ldots, V_n]$ may be sampled by sensors 227, 229, 231, 233, 235, 237, 239, 241, 243, 245, and 247 in electric power grid 200 of FIG. 2 such that n=11. In this example, the electric power grid voltage must be within a predetermined tolerance of a nominal or reference value, such as plus or minus five percent, or plus or minus ten percent, of the reference value (e.g., 120 volts, 208 volts, 240 volts, or 480 volts). However, reliability index subsystem 902 will not necessarily know the reference value, and reference values may vary among locations in an electric power grid. Consequently, some embodiments of reliability index subsystem 902 are configured to infer a reference value for each sensor as the mean, median, or other statistical metric of the time series of voltages for the sensor. Such determination of a separate reference value for each sensor advantageously compensates for sensor mis-calibration.

The methods performed by reliability index subsystem 902 for determining reliability index 904 assume that compliance of electric power grid voltage to a reference value within a predetermined tolerance is given by a Bernoulli random variable. Voltage measured by a given sensor is in conformance, or the measured voltage is a "success," if it is within the predetermined tolerance of the reference value. Reliability index subsystem 902 is configured to apply a one-sided lower confidence level of 1-a, and in some cases, the confidence level is user-configurable. The lower confidence level is used to give a more conservative estimate of the probability of compliance. Number of successes in a set of voltage measurements is non-Gaussian, and score intervals are accordingly defined according to a Clopper-Pearson technique as follows, where m is number of confirming voltage measurements, n is total number of voltage measurements, $p^{upper}$, sometimes referred to as an upper recency-weighted compliance probability, is the probability of measured voltage being less than the reference value plus a positive tolerance value, and $p_{lower}$, sometimes referred to as a lower recency-weighted compliance probability, is the probability of measured voltage being greater than the reference value minus a negative tolerance value:

$$p^{upper} = B(\alpha, m^{under}, n - m^{under} + 1) \tag{EQN. 1}$$

$$p_{lower} = B(\alpha, m^{over}, n - m^{over} + 1) \tag{EQN. 2}$$

m in EQNs. 1 and 2 is the number of voltage measurements that are under the upper voltage tolerance ($m^{under}$ EQN. 1) and above the lower voltage tolerance (mover EQN. 2). Note that $m^{under}$ and mover will be different when the number of over- and under-voltages are different. B in EQNS. 1 and 2 is the Beta function, and B is used because it represents the conjugate prior probability distribution for the voltage measurements, in Bayesian interference. The Beta function is defined in EQN. 3 below, where I of EQN. 3 is the gamma function as defined in EQN. 4.

$$B(\alpha, a, b) = \frac{\Gamma(a+b)\alpha^{a-1}(1-\alpha)^{b-1}}{\Gamma(a)\Gamma(b)} \quad \text{(EQN. 3)}$$

$$\Gamma(z) = \int_0^\infty x^{z-1}e^{-x}dx \quad \text{(EQN. 4)}$$

Certain embodiments of reliability index subsystem 902 are advantageously configured to apply a recency bias such that recent voltage measurements are more-heavily weighted than older voltage measurements. Accordingly, both m and n of EQNS. 1 and 2 are not necessarily integers, and they are weighted values $m_w$ and $n_w$, as defined according to EQNS. 5 and 6 below, where s is a sensor in the set of all sensors $\{S\}$ under consideration for the calculation, $[t_0, t_f]$ is the discrete time interval in which all n voltages are sampled, e.g., such that the voltage measurements are equally spaced in time, $\gamma$ is a decay factor, and $\theta(V)$ is defined by EQNS. 7 and 8 below. In some embodiments, decay factor $\gamma$ is equal to 1/n.

$$m_w = \sum_{s \in \{s\}} \sum_{i=0}^n \theta(V_i^s) e^{\frac{-\gamma(n-i)}{n}} \quad \text{(EQN. 5)}$$

$$n_w = \frac{1 - e^{-(1+\frac{\gamma}{n})}}{1 - e^{-\frac{\gamma}{n}}} \quad \text{(EQN. 6)}$$

$$\theta(V) = \begin{cases} 1 & \text{if } V_{ref} - \delta V_{lower} < V \\ 0 & \text{otherwise} \end{cases} \quad \text{(EQN. 7–lower bound)}$$

$$\theta(V) = \begin{cases} 1 & \text{if } V + \delta V^{upper} < V_{ref} \\ 0 & \text{otherwise} \end{cases} \quad \text{(EQN. 8 – upper bound)}$$

$\delta V_{lower}$ is the lower limit for measured voltage V to be in compliance, $\delta V^{upper}$ is the upper limit for measured voltage I to be in compliance, and $V_{ref}$ is the reference value. EQN. 8 applies when calculating $m_w$ for EQN. 1, and EQN. 7 applies when calculating $m_w$ for EQN. 2. Accordingly, there will be two values of $m_w$-one value for EQN. 1, and another value for EQN. 2. However, $n_w$ will be the same for both EQNS. 1 and 2.

EQNS. 1 and 2 can be modified to reflect the weighted values of m and n to yield EQNS. 9 and 10 below. EQNS. 5 and 8 are used to determine $m_w$ in EQN. 9, EQNS. 5 and 7 are used to determine $m_w$ in EQN. 10, and EQN. 6 is used to determine $n_w$ in both of EQNS. 9 and 10. As discussed above, the Beta function (B) is given by EQN. 3.

$$p^{upper} = B(\alpha, m_w^{under}, n_w - m_w^{under}) \quad \text{(EQN. 9)}$$

$$p_{lower} = B(\alpha, m_w^{over}, n_w - m_w^{over}) \quad \text{(EQN. 10)}$$

One embodiment of reliability index subsystem 902 determines reliability index 904 according to EQN. 11 below, where R is reliability index 904, $p^{upper}$ is defined in EQN. 9 above and $p_{lower}$ is defined in EQN. 10 above.

$$R = p^{upper} p_{lower} \quad \text{(EQN. 11)}$$

In another embodiment, reliability index subsystem 902 determines reliability index 904 according to EQN. 12 below, where R is reliability index 904, $p_{lower}^{upper}$, which is sometimes referred to as a combined upper and lower recency-weighted compliance probability, is defined in EQN. 13, $m_w$ is determined using EQNS. 5 and 14, and $n_w$ is determined using EQN. 6

$$R = p_{lower}^{upper} \quad \text{(EQN. 12)}$$

$$p_{lower}^{upper} = B(\alpha, m_w, n_w) \quad \text{(EQN. 13)}$$

$$\theta(V) = \begin{cases} 1 & \text{if } V_{ref} - \delta V_{lower} < V; V < V_{ref} + \delta V^{upper} \\ 0 & \text{otherwise} \end{cases} \quad \text{(EQN. 14)}$$

Reliability index 904, as determined using EQN. 11 or EQN. 12, has several significant favorable properties. For example, the reliability index has defined minimum and maximum values of zero and one, respectively. Additionally, the reliability index is non-linear by virtue of use of the Beta function. Furthermore, the reliability index has a lookback period of n measurements, and the reliability index has a recency biased as specified by decay factor $\gamma$. Moreover, the reliability index accounts for fluctuations. For example, both voltage sags and voltage surges are handled by the conjunction of the upper and lower score intervals.

Lookback period n, confidence level $1-\alpha$, and decay factor $\gamma$ can be adjusted to achieve desired characteristics of reliability index 904. Increasing lookback period n increases confidence in the reliability index, with the tradeoff of possible recency issues. Decreasing lookback period n causes the reliability index to be more responsive to recent events, with the tradeoff of lower confidence in the reliability index. Increasing confidence level $1-\alpha$ decreases reliability index values but increases confidence in the values. Conversely, decreasing confidence level $1-\alpha$ increases reliability index values but decreases confidence in the values. Increasing decay factor $\gamma$ increases weighing of recent events, while decreasing decay factor $\gamma$ reduces recency bias.

Reliability index subsystem 902 can determine reliability index 904 using variations of the methods discussed above. For example, EQN. 15 below defines a reliability index expressing number of outages per person (OP) over the time interval $[t_0, \ldots]$ for all map cells in an area A, where OP is an alternate embodiment of reliability index 904 determined by some embodiments of reliability index subsystem 902. Within area A, each map cell has a respective population $N_{cell}$. $p_{lower}^{cell}$ and $P_{cell}^{upper}$ are determined using EQNS. 10 and 9, respectively, for each map cell in area A. In some embodiments, the map cells in area A are USNG map cells.

$$OP = \frac{\sum_{cell \in A} \sum_{t=t_0}^{t_f} \left( \left(1 - p_{lower}^{cell}\right) + \left(1 - p_{cell}^{upper}\right)\right) N_{cell}}{\sum_{cell \in A} N_{cell}} \quad \text{(EQN. 15)}$$

As another example, EQN. 16 below defines a reliability index expressing outage hours per population per year (OY), which is a variation of the EQN. 15 reliability index where T is interval of interest and $\Delta T$ is sample time.

$$OY = \frac{\frac{T}{\Delta T} \sum_{cell \in A} \sum_{t=t_0}^{t_f} \left( \left(1 - p_{lower}^{cell}\right) + \left(1 - p_{cell}^{upper}\right)\right) N_{cell}}{\sum_{cell \in A} N_{cell}} \quad \text{(EQN. 16)}$$

Example Instructions

By way of example and not by limitation, the following is one example of instructions that may be executed by one or more processors to perform functions of one example embodiment of power event notification system 100:

```
# event_product.py
"""
A module to publish events to subscribers
"""
import argparse
import json
import logging
import os
import random
import sys
import time
import traceback
import uuid
from collections import defaultdict
from datetime import datetime, timedelta
from itertools import combinations
import gcsfs
import networkx as nx
import pandas as pd
from sqlalchemy import Column, create_engine, DateTime, Integer, MetaData, Table, Text
from sqlalchemy.dialects import postgresql
from sqlalchemy.engine.url import URL
from sqlalchemy.inspection import inspect
from sqlalchemy.sql import select, or_
from usng_utils import USNGCoord
LOG = logging.getLogger('event_product')
LOG_LEVEL_DICT = defaultdict(lambda: logging.INFO)
LOG_LEVEL_DICT['debug'] = logging.DEBUG
# State and event definitions
"""
1 = NORMAL
2 = POWER OFF
3 = NO COMM WITH PRIOR POWER OFF
4 = BROWNOUT
5 = NO COMM WITH NO PRIOR POWER OFF
6 = OTHER
"""
NORMAL = 'Normal'
POWER_OUTAGE = 'Power Outage'
BROWNOUT = 'Brownout'
POSSIBLE_DAMAGE = 'Possible Damage'
DEAD_BATTERY = 'Dead Battery'
COMMUNICATION_DOWN = 'Communication Down'
OTHER = 'Other'
RED_EVENTS = [POWER_OUTAGE, DEAD_BATTERY]
GREEN_EVENTS = [NORMAL]
BROWN_EVENTS = [BROWNOUT]
OTHER_EVENTS = [POSSIBLE_DAMAGE, OTHER]
CURRENT_COLUMNS = ['current_poll_timestamp', 'current_inverter_status',
         'current_input_voltage', 'current_sensor_status']
PREV_COLUMNS = ['prev_poll_timestamp', 'prev_inverter_status',
         'prev_input_voltage', 'prev_sensor_status']
GEOLOC_COLS = ['latitude', 'longitude', 'census_block_fips_code', 'zip_code', 'usng_spatial_address',
         'state_code', 'county_code', 'tract_code']
EVENT_ID_COLUMNS = ['canonical_sensor_id', 'event', 'start_time', 'end_time', 'event_id'] +
GEOLOC_COLS
EVENT_NAME_TO_INDEX = {NORMAL: 1, POWER_OUTAGE: 2, DEAD_BATTERY: 3, BROWNOUT: 4,
         POSSIBLE_DAMAGE: 5, OTHER: 6}
EVENT_INDEX_TO_NAME = {value: key for key, value in EVENT_NAME_TO_INDEX.items( )}
US_NORTH_BOUNDARY = 49.01
US_SOUTH_BOUNDARY = 24.52
US_WEST_BOUNDARY = -124.78
US_EAST_BOUNDARY = -66.95
g_rnd = random.Random( )
g_rnd.seed(123456)
def error_send_notification(error_string, traceback_list):
    LOG.info(f"Sending error: error = {error_string}")
    try:
        fs = gcsfs.GCSFileSystem(project=PROJ_NAME)
        event_bucket = EVENT_BUCKET
        time_now = datetime.utcnow( )
        time_now_str = time_now.strftime("%m-%d-%Y %H:%M:%S UTC")
        time_now_filelabel = time_now.strftime("%m_%d_%Y_%H_%M_%S")
        if traceback_list is not None:
            error_string += "\n\n"
            for entry in traceback_list:
                error_string += entry
        text = f"""\nError occurred at {time_now_str} while processing events:\n\n{error_string}"""
        with fs.open(f"{event_bucket}/ERROR_{time_now_filelabel}.txt", 'w') as f:
            f.write(text)
```

```
        except Exception as e:
            LOG.exception(f"Exception in error_send_notification: {repr(e)}")
    def __format_usng_coords(row):
        usng_coords = row.usng_spatial_address
        usng_split = usng_coords.split( )
        if len(usng_split) != 4:
            LOG.warning(f"Unexpected length of {len(usng_split)} for coordinate: {usng_coords}")
            LOG.warning(f"Canonical sensor ID: {row.canonical_sensor_id}")
            return ""
        gzd = usng_split[0]
        square_id_100k = usng_split[1]
        grid_coord_easting = usng_split[2][0:2].zfill(2)
        grid_coord_northing = usng_split[3][0:2].zfill(2)
        return f"{gzd} {square_id_100k} {grid_coord_easting} {grid_coord_northing}"
    def __format_geographies(df):
        df = df.loc[(df.usng_spatial_address != '0') & (df.census_block_fips_code != 0)]
        df = df.assign(census_block_fips_code=df.census_block_fips_code.astype(str).str.zfill(15))
        df = df.assign(zip_code=df.zip_code.astype(str).str.zfill(5))
        df = df.assign(state_code=df.state_code.astype(str).str.zfill(2))
        df = df.assign(county_code=df.county_code.astype(str).str.zfill(5))
        df = df.assign(usng_spatial_address=df.apply(_format_usng_coords, axis=1))
        return df.assign(tract_code=df.tract_code.astype(str).str.zfill(11))
    def __get_sensor_state(row):
        if row.event in EVENT_NAME_TO_INDEX:
            return EVENT_NAME_TO_INDEX[row.event]
        else:
            return -1
    def __get_event(row):
        if row.sensor_state in EVENT_INDEX_TO_NAME:
            return EVENT_INDEX_TO_NAME[row.sensor_state]
        else:
            return OTHER
    def upsert(conn, table, records):
        # Modified from https://stackoverflow.com/questions/41724658/how-to-do-a-proper-upsert-using-sqlalchemy-on-postgresql
        # get list of fields making up primary key
        primary_keys = [key.name for key in inspect(table).primary_key]
        # assemble base statement
        stmt = postgresql.insert(table).values(records)
        # define dict of non-primary keys for updating
        update_dict = {c.name: c for c in stmt.excluded if not c.primary_key}
        # assemble new statement with 'on conflict do update' clause
        update_stmt = stmt.on_conflict_do_update(index_elements=primary_keys,
                        set_=update_dict)
        result = conn.execute(update_stmt)
        return result
    def get_events(metadata_df):
        """
        Get the events for the day, or events that are not resolved, from the database
        Params:
            metadata_df(pandas.DataFrame): A DataFrame cotaining sensor metadata
        Returns:
            The current event DataFrame
        """
        try:
            db = create_engine(
                URL(
                    drivername=os.environ['EVENT_DRIVER'],
                    username=os.environ['EVENT_USERNAME'],
                    xxxxxx,
                    database=os.environ['EVENT_DATABASE'],
                    host=os.environ['EVENT_DB_HOST'],
                    port='3307'
                )
            )
            with db.connect( ) as conn:
                metadata = MetaData( )
                LOG.info("Creating sensor_events table")
                event_table = Table('sensor_events', metadata,
                        Column('canonical_sensor_id', Integer, nullable=False),
                        Column('event_id', Text, nullable=False),
                        Column('sensor_state', Integer, nullable=False),
                        Column('start_time', DateTime, nullable=False),
                        Column('end_time', DateTime, nullable=False),
                        keep_existing=True
                        )
                cur_time = datetime.utcnow( )
                tomorrow = (cur_time + timedelta(days=1)).strftime('%Y-%m-%d')
                today = cur_time.strftime('%Y-%m-%d')
```

```
            LOG.debug("Querying sensor_events table")
            s = select([event_table.c.canonical_sensor_id, event_table.c.event_id,
                    event_table.c.sensor_state, event_table.c.start_time,
                    event_table.c.end_time]). \
                where(or_(event_table.c.start_time.between(today, tomorrow),
                    (event_table.c.end_time == None)))
            # Do not change the == None! It is not Pythonic but is required for SQLAlchemy!
            r = conn.execute(s).fetchall( )
            df = pd. DataFrame(r, columns=['canonical_sensor_id', 'event_id',
                    'sensor_state', 'start_time', 'end_time'])
            LOG.debug(f"Received {df.shape[0]:,} rows from database")
            df = df.assign(event=df.apply(__get_event, axis=1))
            df = df.assign(start_time=pd.to_datetime(df.start_time))
            df = df.assign(end_time=pd.to_datetime(df.end_time))
            df_merged = df.merge(metadata_df, on='canonical_sensor_id', how='outer')
            return df_merged[EVENT_ID_COLUMNS]
    except Exception as e:
        LOG.exception(f"ERROR: Exception in__insert_events: {repr(e)}")
        traceback.print_exc( )
        LOG.exception(f"ERROR: END")
def __insert_events(event_df):
    try:
        db = create_engine(
            URL(
                drivername=os.environ['EVENT_DRIVER'],
                username=os.environ['EVENT_USERNAME'],
                xxxxx,
                database=os.environ['EVENT_DATABASE'],
                host=os.environ['EVENT_DB_HOST']
            )
        )
        with db.connect( ) as conn:
            metadata = MetaData( )
            LOG.info("Creating sensor_events table")
            event_table = Table('sensor_events', metadata,
                    Column('canonical_sensor_id', Integer, nullable=False),
                    Column('event_id', Text, nullable=False),
                    Column('sensor_state', Integer, nullable=False),
                    Column('start_time', DateTime, nullable=False),
                    Column('end_time', DateTime, nullable=False),
                    keep_existing=True
                    )
            event_df = event_df.assign(sensor_state=event_df.apply(_get_sensor_state, axis=1))
            event_df = event_df[['canonical_sensor_id', 'sensor_state', 'start_time', 'end_time', 'event_id']]
            metadata.create_all(db)
            LOG.debug("Inserting events into sensor_events table")
            result = upsert(conn=conn, table=event_table,
                    records=event_df.to_dict('records'))
            LOG.info(f"Result of insert: {result}")
    except Exception as e:
        LOG.exception(f"ERROR: Exception in_insert_events: {repr(e)}")
        traceback.print_exc( )
        LOG.exception(f"ERROR: END")
def __debug_state_data(df):
    df = df.assign(mso_id=df.mso_sensor_id.str[0:2])
    mso_date_summary = df.groupby('mso_id').agg(
        min_time=pd.NamedAgg(column='current_poll_timestamp', aggfunc='min'),
        max_time=pd.NamedAgg(column='current_poll_timestamp', aggfunc='max'))
    LOG.debug(f"Date min/max per mso:\n{mso_date_summary}")
    sensor_id_diff = df.canonical_sensor_id.isnull( ).sum( )
    if sensor_id_diff > 0:
        LOG.warning(f"There are {sensor_id_diff:,} sensors with no canonical sensor id")
        LOG.warning(f"Missing                       IDs                       by
MSO:\n{df.loc[df.canonical_sensor_id.isnull( )].mso_id.value_counts( )}")
    inverter_status_345_count     =     df.loc[(df.current_inverter_status.isin([3,     4,
5]))].canonical_sensor_id.count( )
    if inverter_status_345_count > 0:
        LOG.warning(f"There are {inverter_status_345_count:,} sensors with inverter status of 3, 4, or 5")
    current_rows = df.shape[0]
    df = df.drop_duplicates(subset=['canonical_sensor_id', 'current_poll_timestamp'])
    new_rows = df.shape[0]
    row_diff = current_rows − new_rows
    if row_diff > 0:
        LOG.warning(f"There are {row_diff:,} duplicate rows in the database")
def __get_current_data(metadata_df):
    """
    A function to retrieve the most recent data from the MySQL database.
```

-continued

```
Params:
    db(sqlalchemy.Engine): A database engine
    metadata_df(pandas.DataFrame): A DataFrame containing sensor metadata
Returns:
    A DataFrame with the most recent sensor data
"""
db = create_engine(
    URL(
        drivername='mysql+pymysql',
        username=MONITORING_DB_USER,
        xxxxx,
        database=MONITORING_DB,
        host=MONITORING_DB_HOST
    )
)
with db.connect( ) as conn:
    metadata = MetaData(conn)
    reading_table = Table('sensor_reading_latest', metadata, autoload=True)
    s = select([reading_table.c.sensor_id, reading_table.c.poll_timestamp,
            reading_table.c.inverter_status, reading_table.c.input_voltage]). \
        where(reading_table.c.poll_timestamp.between(datetime.utcnow( ) - timedelta(minutes=15),
                datetime.utcnow( )))
    r = conn.execute(s).fetchall( )
    df = pd.DataFrame(r, columns=['mso_sensor_id', 'current_poll_timestamp',
            'current_inverter_status', 'current_input_voltage'])
    LOG.debug(f"Received {df.shape[0]:,} rows from database")
    df = df.assign(current_poll_timestamp=pd.to_datetime(df.current_poll_timestamp))
    df = df.groupby(['mso_sensor_id', 'current_poll_timestamp']).last( )
    df = df.reset_index( )
    df = df.merge(metadata_df, on='mso_sensor_id', how='left')
    if LOG.level == logging.DEBUG:
        __debug_state_data(df)
    # Remove bad geographies
    df = df.loc[df.census_block_fips_code != '0' * 15]
    """
    From PENS spec
    For each sensor, identify state:
        Normal: Input voltage +/- 10% of inferred voltage and inverter status = 1
    Low Voltage: Input voltage <90% of inferred voltage and inverter status = 1 (may be for internal use
only)
    Brownout: Positive input voltage and inverter status = 2
    Power Outage: voltage = 0 and inverter status = 2 or null voltage and inverter status of 2.
    Communication Down: Null voltage and inverter status (presumes previous state is normal
    operating state, or prolonged outage)
    Other: any other state. Warn about inverter status of 3, 4, 5
    Note: low voltage is not implemented yet as we don't have easy access to inferred voltage
    """
    df = df.loc[(df.canonical_sensor_id.notnull( )) & (df.current_poll_timestamp.notnull( ))]
    LOG.debug(f"Returning {df.shape[0]:,} database rows after filtering")
    df = df.assign(current_sensor_status=OTHER)
    df.loc[(df.current_inverter_status == 1.0) &
        ((df.current_input_voltage > 0.0) |
        (df.current_input_voltage.isnull( ))), 'current_sensor_status'] = NORMAL
    df.loc[(df.current_inverter_status == 2.0) &
        (df.current_input_voltage > 0.0), 'current_sensor_status'] = BROWNOUT
    df.loc[(df.current_inverter_status == 2.0) &
        ((df.current_input_voltage == 0.0) |
        (df.current_input_voltage.isnull( ))), 'current_sensor_status'] = POWER_OUTAGE
    df.loc[(df.current_inverter_status.isnull( )) &
        (df.current_input_voltage.isnull( )), 'current_sensor_status'] = COMMUNICATION_DOWN
    cols = ['canonical_sensor_id'] + CURRENT_COLUMNS + GEOLOC_COLS
    df = df[cols]
    return df
def __create_uuid(row):
    return str(uuid. UUID(int=g_rnd.getrandbits(128)))
def __assign_event_family(row):
    if row.event in RED_EVENTS:
        return 'Red'
    if row.event in GREEN_EVENTS:
        return 'Green'
if row.event in BROWN_EVENTS:
return 'Brown'
    return OTHER
def __correlate_close_events(state_transition_df, close_sensors):
    """
    A function to correlate events that are in neighboring USNG 1 km squares.
    Params:
        state_transition_df(pandas.DataFrame): A DataFrame containing events
        close_sensors(pandas. DataFrame): A DataFrame containing sensors within 1 mile of each other
```

```
    Returns:
        The state_transition DataFrame with an event_id column added
    """
    all_close_sensors = set(close_sensors.sensor_1.unique( )) \
        .union(set(close_sensors.sensor_2.unique( )))
    state_transition_df = state_transition_df.assign(group_id='')
    close_events
state_transition_df.loc[state_transition_df.canonical_sensor_id.isin(all_close_sensors)].copy( )
    # Group sensors by event, then create common Event IDs for sensors with same event that
    # are a connected component in the distance graph
    close_events = close_events.assign(event_family=OTHER)
    close_events.loc[close_events.event.isin(RED_EVENTS), 'event_family'] = 'Red'
    close_events.loc[close_events.event.isin(GREEN_EVENTS), 'event_family'] = 'Green'
    close_events.loc[close_events.event.isin(BROWN_EVENTS), 'event_family'] = 'Brown'
    event_grouped = close_events.groupby('event_family')
    for event, grouped_df in event_grouped:
        if grouped_df.shape[0] == 1:
            group_sensor = grouped_df.canonical_sensor_id.values[0]
            close_events.loc[close_events.canonical_sensor_id == group_sensor, 'group_id'] = \
                str(uuid.UUID(int=g_rnd.getrandbits(128)))
        # Create a graph of sensors with the same event type. Create an edge between sensors s1 and s2
        # if the sensors are USNG neighbors and share the same event.
        G = nx.Graph( )
        group_close_sensors = close_sensors.loc[(close_sensors.sensor_1
                            .isin
                            (grouped_df.canonical_sensor_id.unique( ))) &
                            (close_sensors.sensor_2
                            .isin
                            (grouped_df.canonical_sensor_id.unique( )))]
        G.add_edges_from([(x, y) for x, y in
                zip(group_close_sensors.sensor_1.values,
                    group_close_sensors.sensor_2.values)])
        # Find all connected components to get contiguous list of sensors that are USNG neighbors
        components = list(nx.algorithms.components.connected_components(G))
        # Add correlated sensor events to Event DF. Assign Event IDs
        component_uuid_dict = {_create_uuid(0): list(x) for x in components}
        for component_uuid, component_sensors in component_uuid_dict.items( ):
            close_events.loc[close_events.canonical_sensor_id.isin(component_sensors), 'group_id'] =
component_uuid
    other_events =
state_transition_df.loc[~state_transition_df.canonical_sensor_id.isin(all_close_sensors)].copy( )
    try:
        assert (len(set(other_events.canonical_sensor_id.unique( )).intersection(all_close_sensors)) == 0)
    except AssertionError as e:
        LOG.exception(f"There is overlap between close and other sensors: {e}")
    try:
        assert (set(other_events.canonical_sensor_id.unique( )).union(all_close_sensors) ==
            set(state_transition_df.canonical_sensor_id.unique( )))
    except AssertionError as e:
        LOG.exception(f"Some sensors left out of event ID: {e}")
    other_events = other_events.assign(group_id=other_events.apply(__create_uuid, axis=1))
    return pd.concat([close_events, other_events], ignore_index=True)
def __get_usng_neighbors(row):
    usng_obj = USNGCoord(row.usng_spatial_address, row.latitude, row.longitude)
    return list(usng_obj.get_all_neighbors( ).values( ))
def __get_event_index(row):
    return int(row.event_id.split('_')[-1])
def __get_event_id_date_str(row):
    return '_'.join(row.event_id.split('_')[0:3])
def get_event_index_dict(df):
    event_index_dict = defaultdict(int)
    if not df.empty:
        try:
            event_id_df = df.loc[df.event_id.str.contains('Event')].copy( )
            if not event_id_df.empty:
                event_id_df = event_id_df.assign(event_date_str=event_id_df.apply(__get_event_id_date_str,
axis=1))
                for event_date_str, grouped_df in event_id_df.groupby('event_date_str'):
                    max_index = grouped_df.apply( __get_event_index, axis=1).max( )
                    event_index_dict[event_date_str] = max_index
        except AttributeError as e:
            LOG.exception(f"No event_id column in DataFrame!")
        except KeyError as e:
            LOG.exception(f"Incorrect format for event_id column")
    return event_index_dict
```

```
def get_completed_events(state_transition_df, event_df):
    incomplete_events = event_df.loc[event_df.end_time.isnull( )].copy( )
    complete_events = event_df.loc[event_df.end_time.notnull( )].copy( )
    existing_event_df = \
        (state_transition_df.loc[
state_transition_df.canonical_sensor_id.isin(incomplete_events.canonical_sensor_id.unique( ))]).copy( )
    new_event_df = (state_transition_df.loc[~state_transition_df.canonical_sensor_id.isin
    (existing_event_df.canonical_sensor_id.unique( ))]).copy( )
    # Pair changes in events with existing events
    if existing_event_df.empty:
        LOG.debug(f"get_completed_events no existing events")
        return event_df, state_transition_df
    else:
        existing_event_df = existing_event_df[['canonical_sensor_id', 'start_time', 'event']]
        existing_event_df = existing_event_df.rename(columns={'start_time': 'event_time',
                            'event': 'new_event'})
        event_merged    =    incomplete_events.merge(existing_event_df,    on='canonical_sensor_id',
how='outer')
        event_merged.loc[(event_merged.event.isin([POWER_OUTAGE, BROWNOUT,
                        COMMUNICATION_DOWN, POSSIBLE_DAMAGE,
                        DEAD_BATTERY])) &
                (event_merged.new_event == NORMAL),
                'end_time'] = event_merged.event_time
        # If transitioning from Power Outage or Brownout to Dead Battery, complete the
        # previous event and make a new event
        event_merged.loc[(event_merged.event.isin([(POWER_OUTAGE, BROWNOUT)])) &
                (event_merged.new_event == DEAD_BATTERY),
                'end_time'] = event_merged.event_time
        # If transitioning from Dead Battery or Comms Down to Brownout or Power Outage, complete the
        # previous event and make a new event
        event_merged.loc[(event_merged.event.isin([(DEAD_BATTERY, COMMUNICATION_DOWN,
                        POSSIBLE_DAMAGE])) &
                (event_merged.new_event.isin([POWER_OUTAGE, BROWNOUT])),
                'end_time'] = event_merged.event_time
        dead_battery_events    =    event_merged.loc[(event_merged.event.isin([(POWER_OUTAGE,
BROWNOUT)])) &
                        (event_merged.new_event == DEAD_BATTERY)]
        power_out_events    =    event_merged.loc[(event_merged.event.isin([DEAD_BATTERY,
COMMUNICATION_DOWN,
                            POSSIBLE_DAMAGE])) &
                    (event_merged.new_event.isin([POWER_OUTAGE, BROWNOUT]))]
        # Add the dead battery and power out events to new events
        new_event_df = new_event_df.append(pd.concat([dead_battery_events, power_out_events],
                        ignore_index=True), ignore_index=True)
    return pd.concat([complete_events, event_merged[EVENT_ID_COLUMNS], ignore_index=True),
new_event_df
def get_sensor_neighbors(event_df):
    """
    Find all USNG sensor neighbors
    Params:
        event_df(pandas. DataFrame): A DataFrame containing sensors and events
    Returns:
        All sensors from the event DataFrame that are USNG neighbors
    """
    loc_df = event_df[['canonical_sensor_id', 'usng_spatial_address', 'latitude', 'longitude']]
    loc_df = loc_df.drop_duplicates( )
    loc_df = loc_df.assign(neighbors=loc_df.apply(__get_usng_neighbors, axis=1))
    unique_ids = event_df.canonical_sensor_id.unique( )
    if len(unique_ids) == 1:
        return event_df.assign(group_id=event_df.apply(_create_uuid, axis=1))
    elif len(unique_ids) > 1:
        all_combinations = set(combinations(unique_ids, 2))
        neighbor_dict = defaultdict(list)
        # Find pairwise neighbors for all combinations
        for sensor_1, sensor_2 in all_combinations:
            sensor_1_usng    =    loc_df.loc[loc_df.canonical_sensor_id    ==    sensor_1,
'usng_spatial_address'].item( )
            sensor_2_usng    =    loc_df.loc[loc_df.canonical_sensor_id    ==    sensor_2,
'usng_spatial_address'].item( )
            sensor_1_neighbors = loc_df.loc[loc_df.canonical_sensor_id == sensor_1, 'neighbors'].item( )
            sensor_2_neighbors = loc_df.loc[loc_df.canonical_sensor_id == sensor_2, 'neighbors'].item( )
            neighbor_dict['sensor_1'].append(sensor_1)
            neighbor_dict['sensor_2'].append(sensor_2)
```

```
        neighbor_sensors = (sensor_1_usng == sensor_2_usng or
                sensor_2_usng in sensor_1_neighbors or
                sensor_1_usng in sensor_2_neighbors)
        neighbor_dict['neighbor_sensors'].append(neighbor_sensors)
    neighbor_df = pd.DataFrame(neighbor_dict)
    close_sensors = neighbor_df.loc[neighbor_df.neighbor_sensors]
    return close_sensors
def assign_event_ids(updated_event_df, event_df):
    """
    Assign Event IDs to all events, both new and existing,
    whether involving single or multiple sensors.
    Event IDs should be of the format mm_dd_YYYY_Event_index, with the date being
    the date of the earliest sensor start time for the event. If separate events
    merge into a new event, then a new event index should be created.
    Params:
        updated_event_df(pandas.DataFrame): A DataFrame with new events
        event_df(pandas.DataFrame): A DataFrame with existing events
    Returns:
        A DataFrame with new and existing events
    """
    for group_id in updated_event_df.group_id.unique( ):
        event_index_dict      =      get_event_index_dict(pd.concat([event_df,       updated_event_df],
ignore_index=True))
        group_df = updated_event_df.loc[updated_event_df.group_id == group_id]
        existing_event_id_df = group_df.loc[group_df.event_id.str.contains('Event')]
        if existing_event_id_df.empty:
            event_date_str = group_df.start_time.min( ).strftime('%m_%d_%Y')
            event_index = event_index_dict[event_date_str] + 1
            event_id = f'{event_date_str}_Event_{event_index}'
            updated_event_df.loc[updated_event_df.group_id == group_id, 'event_id'] = event_id
        else:
            existing_ids = existing_event_id_df.event_id.unique( )
            if len(existing_ids) == 1:
                updated_event_df.loc[updated_event_df.group_id == group_id, 'event_id'] = existing_ids[0]
            else:
                event_date_str = group_df.start_time.min( ).strftime('%m_%d_%Y')
                event_index = event_index_dict[event_date_str] + 1
                event_id = f'{event_date_str}_Event_{event_index}'
                updated_event_df.loc[updated_event_df.group_id == group_id, 'event_id'] = event_id
    return updated_event_df
def __correlate_events(state_transition_df, event_df):
    """
    A function to assign an Event ID to correlated events. Events are considered
    correlated if they are USNG neighbors and share the same event type. Correlated
    events are assigned an Event ID. Existing events can be modified to include new
    sensors or to include an end time for a current sensor if the event has ended
    for that sensor (i.e., a sensor with a power outage has power restored).
    Params:
        state_transition_df(pandas.DataFrame): A DataFrame containing state transitions
        event_df(pandas.DataFrame): A DataFrame containing events
    Returns:
        The event DataFrame with an event_id column added
    """
    try:
        state_transition_df = state_transition_df.assign(end_time=pd.NaT)
        state_transition_df = state_transition_df.rename(columns={'current_poll_timestamp': 'start_time'})
        state_transition_df = state_transition_df.assign(event_id='')
        # If there isn't an existing event DataFrame, assign new Event IDs to all correlated events
        if event_df.empty:
            LOG.debug("Calling get_sensor_neighbors")
            sensor_neighbors = get_sensor_neighbors(state_transition_df)
            if sensor_neighbors.empty:
                state_transition_df
state_transition_df.assign(group_id=state_transition_df.apply(__create_uuid,
                                           axis=1))
            else:
                LOG.debug("Calling __correlate_close_events")
                state_transition_df = __correlate_close_events(state_transition_df=state_transition_df,
                                       close_sensors=sensor_neighbors)
            for group_id in state_transition_df.group_id.unique( ):
                event_index_dict = get_event_index_dict(state_transition_df)
                group_df = state_transition_df.loc[state_transition_df.group_id == group_id]
                event_date_str = group_df.start_time.min( ).strftime('%m_%d_%Y')
                event_index = event_index_dict[event_date_str] + 1
                event_id = f'{event_date_str}_Event_{event_index}'
                state_transition_df.loc[state_transition_df.group_id == group_id, 'event_id'] = event_id
            state_transition_df = state_transition_df.loc[state_transition_df.event != NORMAL]
            return state_transition_df[EVENT_ID_COLUMNS].sort_values(by='event_id')
        # If there are existing events look for event modifications in the state transition DataFrame
```

```
        else:
            # First, find any current sensors that are no longer experiencing the event
            prev_event_rows = event_df.shape[0]
            LOG.debug("Calling get_completed_events")
            event_df, new_event_df = get_completed_events(state_transition_df=state_transition_df,
                       event_df=event_df)
            new_event_rows = event_df.shape[0]
            if prev_event_rows > new_event_rows:
                LOG.warning(f"__correlate_events there are {prev_event_rows - new_event_rows}"
                       f" fewer rows after calling get_completed_events")
            # We only care about the Normal state if the sensor was previously involved in an event
            new_event_df = new_event_df.loc[new_event_df.event != NORMAL]
            incomplete_events = event_df.loc[event_df.end_time.isnull( )].copy( )
            complete_events = event_df.loc[event_df.end_time.notnull( )].copy( )
            # For incomplete events, find sensors that may be added to the event
            updated_event_df = pd.concat([new_event_df, incomplete_events], ignore_index=True)
            if not updated_event_df.empty:
                LOG.debug("Calling get_sensor_neighbors")
                sensor_neighbors = get_sensor_neighbors(updated_event_df)
                LOG.debug("Calling __correlate_close_events")
                updated_event_df =_ correlate_close_events(state_transition_df=updated_event_df,
                         close_sensors=sensor_neighbors)
                LOG.debug("Calling assign_event_ids")
                updated_event_df = assign_event_ids(updated_event_df, event_df)
            updated_event_df = pd.concat([complete_events, updated_event_df], ignore_index=True)
            updated_event_df = updated_event_df[EVENT_ID_COLUMNS]
            if event_df.shape[0] > updated_event_df.shape[0]:
                LOG.debug(f"__correlate_events - Events lost in updated_event_df: "
                       f"{event_df.shape[0] - updated_event_df.shape[0]}")
                missing_outages = state_transition_df.loc[(state_transition_df.event.isin(RED_EVENTS)) &
                       (~state_transition_df.canonical_sensor_id.isin(
                           updated_event_df.canonical_sensor_id.unique( )))
                       ]
            if not missing_outages.empty:
                LOG.warning(f"__correlate_events, missing outages: {missing_outages}")
            return updated_event_df.sort_values(by='event_id')
    except TypeError as e:
        LOG.exception(f"Exception in correlate_events: {repr(e)}")
        # TODO: Find better action!
        LOG.exception(f"ERROR: Exception in correlate_events: {repr(e)}")
        traceback.print_exc( )
        LOG.exception(f"ERROR: END")
        return event_df.assign(event_id=event_df.apply(__create_uuid, axis=1))
    except Exception as e:
        LOG.exception(f"Exception in correlate_events: {repr(e)}")
        LOG.exception(f"ERROR: Exception in correlate_events: {repr(e)}")
        traceback.print_exc( )
        LOG.exception(f"ERROR: END")
        return event_df.assign(event_id=event_df.apply(__create_uuid, axis=1))
def __get_lat_lon_str(row):
    return f"lat: {row.latitude};lon:{row.longitude}"
def __get_metadata_df(fs):
    try:
        db = create_engine(
            URL(
                drivername=os.environ['EVENT_DRIVER'],
                username=os.environ['EVENT_USERNAME'],
                xxxxx,
                database=os.environ['EVENT_DATABASE'],
                host=os.environ['EVENT_DB_HOST']
            )
        )
        LOG.debug("Connecting to database")
        with db.connect( ) as conn:
            metadata = MetaData(conn)
            metadata_table = Table('metadata', metadata, autoload=True)
            LOG.debug("Querying metadata tables")
            s = select([metadata_table.c.mso_sensor_id, metadata_table.c.canonical_sensor_id])
            r = conn.execute(s).fetchall( )
            metadata_df = pd. DataFrame(r, columns=['mso_sensor_id', 'canonical_sensor_id'])
            geoloc_table = Table('geoloc', metadata, autoload=True)
            LOG.debug("Querying geoloc table")
            s = select([geoloc_table.c.canonical_sensor_id, geoloc_table.c.latitude,
                       geoloc_table.c.longitude, geoloc_table.c.census_block_fips_code,
                       geoloc_table.c.county_fips_code, geoloc_table.c.state_fips_code,
                       geoloc_table.c.zip_code, geoloc_table.c.census_tract_fips_code,
                       geoloc_table.c.usng_spatial_address])
            r = conn.execute(s).fetchall( )
            geoloc_df = pd.DataFrame(r, columns=['canonical_sensor_id', 'latitude', 'longitude',
```

```
                        'census_block_fips_code', 'county_code',
                        'state_code', 'zip_code', 'tract_code',
                        'usng_spatial_address'])
        combined_df = geoloc_df.merge(metadata_df, on='canonical_sensor_id')
        LOG.debug("Removing bad location sensors from metadata")
        combined_df = combined_df.dropna(subset=['latitude', 'longitude',
                        'usng_spatial_address',
                        'census_block_fips_code'])
        combined_df = combined_df.loc[combined_df.usng_spatial_address.str.len( ) > 0]
        loc_df = combined_df[['canonical_sensor_id', 'latitude', 'longitude']]
        loc_df = loc_df.loc[(loc_df.latitude >= US_SOUTH_BOUNDARY) &
                (loc_df.latitude <= US_NORTH_BOUNDARY) &
                (loc_df.longitude >= US_WEST_BOUNDARY) &
                (loc_df.longitude <= US_EAST_BOUNDARY)]
        loc_df = loc_df.assign(lat_lon_str=loc_df.apply(__get_lat_lon_str, axis=1))
        sensor_loc_summary                                                             =
loc_df.groupby('lat_lon_str').canonical_sensor_id.nunique( ).to_frame('num_sensors')
        sensor_loc_summary = sensor_loc_summary.reset_index( )
        bad_locs = sensor_loc_summary.loc[sensor_loc_summary.num_sensors > 4].lat_lon_str.unique( )
        bad_loc_df = loc_df.loc[loc_df.lat_lon_str.isin(bad_locs)]
        combined_df                                                                     =
combined_df.loc[~combined_df.canonical_sensor_id.isin(bad_loc_df.canonical_sensor_id.unique( ))]
        combined_df = __format_geographies(combined_df)
        return combined_df
    except Exception as e:
        LOG.exception(f"Exception in get_metadata: {e}")
        with fs.open(f"{EVENT_BUCKET}/metadata/current_metadata.csv", 'r') as f:
            metadata_df = pd.read_csv(f)
        metadata_df = __format_geographies(metadata_df)
        return metadata_df
def __get_initial_state_transition_df(state_df):
    """
    Finds potential events from the initial sensor states
    Params:
        state_df(pandas.DataFrame): A DataFrame containing sensor states
    Returns:
        A DataFrame, which may be empty, with state transitions
    """
    event_df = state_df.assign(event=state_df.current_sensor_status)
    event_df = event_df.loc[event_df.event.isin([BROWNOUT, POWER_OUTAGE])]
    return event_df.drop_duplicates(subset=['canonical_sensor_id', 'current_poll_timestamp'])
def __update_previous_sensor_state(merged_df):
    """
    Updates the previous sensor status and previous sensor poll timestamp
    columns with current status and timestamp if available.
    Params
        merged_df(pandas.DataFrame): A DataFrame that is an outer merge of
        the current and previous state DataFrames
    Returns:
        An previous sensor state DataFrame
    """
    """
    There are three cases that could occur with merged_df
    1) A sensor ID appears in prev_sensor_state but not in current_sensor_state,
       in which case all the current columns will be null. Since there is no
       update, do nothing with these prev columns.
    2) A sensor ID appears in current_sensor_state but not in prev_sensor_state,
       so the prev columns will be null. In this case, set the prev columns to
       the values of the current columns.
    3) A sensor ID appears in both. In this case set the prev columns to the
       values of the current columns.
    """
    # If a sensor has a current state or current poll timestamp, update respective
    # prev columns to the current column values. This covers cases 2 and 3.
    LOG.debug(f"_update_previous_sensor_state merged_df initial has {merged_df.shape[0]:,} rows")
    merged_df.loc[merged_df.current_sensor_status.notnull( ),      'prev_sensor_status']      =
merged_df.current_sensor_status
    merged_df.loc[merged_df.current_poll_timestamp.notnull( ),     'prev_poll_timestamp']     =
merged_df.current_poll_timestamp
    merged_df.loc[merged_df.current_sensor_status.notnull( ),      'prev_inverter_status']    =
merged_df.current_inverter_status
    merged_df.loc[merged_df.current_sensor_status.notnull( ),      'prev_input_voltage']      =
merged_df.current_input_voltage
    LOG.debug(f"_update_previous_sensor_state merged_df final has {merged_df.shape[0]:,} rows")
    return merged_df[['canonical_sensor_id'] + PREV_COLUMNS + ['usng_spatial_address']]
def __ get_state_transition_df(state_df):
    """
    A function to assign state transitions to a current state DataFrame.
    Params:
        state_df(pandas. DataFrame): A DataFrame containing sensor states
```

```
Returns:
    A DataFrame with events assigned
"""
"""
From PENS Spec:
For each sensor, identify state transition from previous known state
Classify event as
"red" - outage - hard down (comms and power) | | power down
    Normal -> Power Outage
    Brownout -> Power Outage
    Power Outage -> Communication down
    Low voltage -> Power Outage
"green" - restoration - return to normal:
    Power Outage -> Normal
    Communication Down -> Normal (only consider restoration if Communication down was preceded by
Power Outage)
    Low Voltage -> Normal
    Brownout -> Normal
"brown" - inverter status=1, voltage low | | investor status = 2, voltage > 0
    Normal -> Brownout
    Normal -> Low voltage
    Power Outage -> Brownout
    Power Outage -> Low Voltage
    Brownout -> Low Voltage
    Low Voltage -> Brownout
"Other":
    Normal -> Communication down (if extended period of communication down, could indicate physical
damage)
"""
    state_transition_df = state_df.copy( )
    state_transition_df = state_transition_df.assign(event=state_transition_df.current_sensor_status)
    state_transition_df.loc[(state_transition_df.prev_sensor_status.isin([POWER_OUTAGE, BROWNOUT]))
&(
        state_transition_df.current_sensor_status      ==      COMMUNICATION_DOWN),     'event']     =
DEAD_BATTERY
    state_transition_df.loc[(state_transition_df.current_sensor_status == COMMUNICATION_DOWN) & (
        state_transition_df.prev_sensor_status == NORMAL), 'event'] = POSSIBLE_DAMAGE
    state_transition_df = state_transition_df.loc[(state_transition_df.prev_sensor_status.isnull( )) |
                    (state_transition_df.prev_sensor_status !=
                    state_transition_df.current_sensor_status)]
    state_transition_df = state_transition_df.loc[(state_transition_df.event.notnull( )) &
                    (state_transition_df.event != OTHER)]
    return state_transition_df.drop_duplicates(subset=['canonical_sensor_id', 'current_poll_timestamp'])
def __merge_state_dfs(previous_state_df, current_state_df):
    state_df = previous_state_df.merge(current_state_df, on=['canonical_sensor_id',
                    'usng_spatial_address'],
                how='outer')
    LOG.debug(f"__merge_state_dfs state_df initial has {state_df.shape[0]:,} rows")
    incorrect_dates = state_df.loc[(state_df.current_poll_timestamp.notnull( )) &
            (state_df.prev_poll_timestamp.notnull( )) &
            (state_df.current_poll_timestamp < state_df.prev_poll_timestamp)]
    if not incorrect_dates.empty:
        LOG.debug(f"There are {incorrect_dates.shape[0]:,} rows where current date < previous date")
        # Attempt to swap current and previous data
        state_df                                                                                       =
state_df.loc[~state_df.canonical_sensor_id.isin(incorrect_dates.canonical_sensor_id.unique( ))]
        incorrect_date_sensors = incorrect_dates.canonical_sensor_id.unique( )
        prev_incorrect_sensors = previous_state_df.loc[previous_state_df.canonical_sensor_id
            .isin(incorrect_date_sensors)]
        current_incorrect_sensors = current_state_df.loc[current_state_df.canonical_sensor_id
            .isin(incorrect_date_sensors)]
        prev_to_current_rename_dict = {x: y for x, y in zip(PREV_COLUMNS, CURRENT_COLUMNS)}
        current_to_prev_rename_dict = {x: y for x, y in zip(CURRENT_COLUMNS, PREV_COLUMNS)}
        prev_incorrect_sensors = prev_incorrect_sensors.rename(columns=prev_to_current_rename_dict)
        current_incorrect_sensors                                                                      =
current_incorrect_sensors.rename(columns=current_to_prev_rename_dict)
        incorrect_sensors_merged = prev_incorrect_sensors.merge(current_incorrect_sensors,
                        on=['canonical_sensor_id',
                        'usng_spatial_address'],
                        how='outer')
        state_df = pd.concat([state_df, incorrect_sensors_merged])
# Eliminate duplicate state data
state_df = state_df.loc[(state_df.current_poll_timestamp.isnull( )) |
            (state_df.prev_poll_timestamp.isnull( )) |
            ((state_df.current_poll_timestamp.notnull( )) |
            (state_df.prev_poll_timestamp.notnull( )) &
            (state_df.current_poll_timestamp >= state_df.prev_poll_timestamp))]
    LOG.debug(f"__merge_state_dfs state_df final has {state_df.shape[0]:,} rows")
    return state_df
```

```
def _get_initial_state_dfs(fs, current_df):
    previous_state_df = pd.DataFrame( )
    if fs.exists(f'{EVENT_BUCKET}/previous_state_df.csv"):
        LOG.debug("Reading previous state from bucket")
        with fs.open(f'{EVENT_BUCKET}/previous_state_df.csv") as f:
            previous_state_df = pd.read_csv(f)
            previous_state_df = previous_state_df.assign(
                prev_poll_timestamp=pd.to_datetime(
                    previous_state_df.prev_poll_timestamp))
    if previous_state_df.empty:
        LOG.debug("Calling __get_initial_state_transition_df")
        state_transition_df = __get_initial_state_transition_df(state_df=current_df)
        rename_dict = {old_name: new_name for old_name, new_name in zip(CURRENT_COLUMNS,
PREV_COLUMNS)}
        previous_state_df = current_df.rename(columns=rename_dict)
        previous_state_df = previous_state_df[['canonical_sensor_id'] +
                            PREV_COLUMNS + ['usng_spatial_address']]
    else:
        state_df =_ merge_state_dfs(previous_state_df=previous_state_df,
                         current_state_df=current_df)
        LOG.debug("Calling _get_state_transition_df")
        state_transition_df = __ get_state_transition_df(state_df=state_df)
        previous_state_rows = previous_state_df.shape[0]
        previous_state_df =_ update_previous_sensor_state(state_df)
        updated_previous_state_rows = previous_state_df.shape[0]
        if updated_previous_state_rows < previous_state_rows:
            LOG.warning(f"There were {previous_state_rows:, } in previous_state_df, "
                f"now there are {updated_previous_state_rows:,} rows")
    return previous_state_df, state_transition_df
def_initialize_states(fs, metadata_df):
    cur_date_str = datetime.utcnow( ).strftime('%Y-%m-%d')
    LOG.info("Getting current data")
    current_df =_ get_current_data(metadata_df=metadata_df)
    previous_state_df, state_transition_df =__ get_initial_state_dfs(fs, current_df)
    # TODO: Replace with database call!
    with fs.open(f'{EVENT_BUCKET}/previous_state_df.csv", 'w') as f:
        LOG.debug("Writing previous state to bucket")
        previous_state_df.to_csv(f, index=False, index_label=False)
    event_df = pd.DataFrame( )
    # TODO: Replace with database call!
    if fs.exists(f'{EVENT_BUCKET}/{cur_date_str}_events.csv"):
        LOG.debug("Reading event_df from bucket")
        with fs.open(f'{EVENT_BUCKET}/{cur_date_str}_events.csv") as f:
            event_df = pd.read_csv(f)
            event_df = event_df.assign(start_time=pd.to_datetime(event_df.start_time))
            event_df = event_df.assign(end_time=pd.to_datetime(event_df.end_time))
            event_df = event_df.loc[event_df.start_time.notnull( )]
            event_df = __format_geographies(event_df)
if not state_transition_df.empty:
    LOG.info(f"There are {state_transition_df.shape[0]:,} state transitions")
    prev_state_transitions = state_transition_df.shape[0]
    LOG.debug("Calling_correlate_events")
    event_df =__correlate_events(state_transition_df=state_transition_df,
                event_df=event_df)
    new_state_transitions = state_transition_df.shape[0]
    if new_state_transitions < prev_state_transitions:
        LOG.warning(f"There are {prev_state_transitions - new_state_transitions} "
            f"fewer state transitions after calling _correlate_events")
    outage_ids = previous_state_df.loc[previous_state_df.prev_sensor_status
        .isin([POWER_OUTAGE,
            BROWNOUT])] \
        .canonical_sensor_id.unique( )
    event_sensor_ids = event_df.canonical_sensor_id.unique( )
    id_diff = set(outage_ids).difference(set(event_sensor_ids))
    if len(id_diff) > 0:
        cur_time_str = datetime.utcnow( ).strftime('%Y-%m-%d_%H_%M')
        LOG.warning(f"There are {len(id_diff)} sensor IDs with outages and no event")
        state_transition_missing = (state_transition_df.loc
            [state_transition_df.canonical_sensor_id.isin(outage_ids)])
        previous_state_missing = (previous_state_df.loc
            [previous_state_df.canonical_sensor_id.isin(outage_ids)])
        state_transition_missing.to_csv(f"{cur_time_str}_missing_state_transitions.csv",
                    index=False, index_label=False)
        previous_state_missing.to_csv(f"{cur_time_str}_missing_previous_state.csv",
                    index=False, index_label=False)
    # TODO: Temporarily commenting out
    #__ insert_events(event_df)
    with fs.open(f'{EVENT_BUCKET}/{cur_date_str}_events.csv", 'w') as f:
        event_df.to_csv(f, index=False, index_label=False)
```

-continued

```
    return previous_state_df, event_df
def publish_events( ):
    """
    The main function to grab data from the MySQL database every five minutes,
    identify and correlate events, write the events as CSV files to a Storage
    Bucket, and write events to the event database.
    """
    try:
        fs = gcsfs.GCSFileSystem(project=PROJ_NAME, token='cloud')
        metadata_df = _get_metadata_df(fs)
        cur_time = datetime.utcnow( )
        last_time = datetime.now( )
        previous_state_df, event_df =_ initialize_states(fs=fs, metadata_df=metadata_df)
        while True:
            now_time = datetime.now( )
            delta = now_time - last_time
            # Make sure time_to_sleep is non-negative
            time_to_sleep = max(1, 300 - int(delta.total_seconds( )))
            if int(delta.total_seconds( )) > 300:
                LOG.error("ERROR: event processing time exceeded 5 minutes")
                error_send_notification(f"ERROR: event processing time exceeded 5 minutes", None)
            LOG.debug(f"Sleeping for {time_to_sleep} seconds")
            time.sleep(time_to_sleep)
            last_time = datetime.now( )
            LOG.info("Getting current data")
            current_df = __get_current_data(metadata_df=metadata_df)
            state_df = __merge_state_dfs(previous_state_df=previous_state_df,
                            current_state_df=current_df)
            prev_time = cur_time
            cur_time = datetime.utcnow( )
            cur_time_str = cur_time.strftime('%Y-%m-%d_%H_%M')
            cur_date_str = cur_time.strftime('%Y-%m-%d')
            LOG.debug("Calling_get_state_transition_df")
            state_transition_df = _get_state_transition_df(state_df=state_df)
            alert_cols = ['canonical_sensor_id', 'current_poll_timestamp', 'event'] + GEOLOC_COLS
            state_transition_df = state_transition_df[alert_cols]
            previous_state_rows = previous_state_df.shape[0]
            previous_state_df = _update_previous_sensor_state(state_df)
            updated_previous_state_rows = previous_state_df.shape[0]
            if updated_previous_state_rows < previous_state_rows:
                LOG.warning(f"There were {previous_state_rows:,} in previous_state_df, "
                        f"now there are {updated_previous_state_rows:, } rows")
            with fs.open(f"{EVENT_BUCKET}/previous_state.csv", 'w') as f:
                LOG.debug("Writing previous state to bucket")
                previous_state_df.to_csv(f, index=False, index_label=False)
            if prev_time.hour != cur_time.hour:
                metadata_df = _get_metadata_df(fs)
            LOG.info(f"There are {state_transition_df.shape[0]:,} state transitions at {cur_time_str}")
            if not state_transition_df.empty:
                LOG.debug("Calling_correlate_events")
                prev_state_transitions = state_transition_df.shape[0]
                event_df =_ correlate_events(state_transition_df=state_transition_df,
                            event_df=event_df)
                new_state_transitions = state_transition_df.shape[0]
                if new_state_transitions < prev_state_transitions:
                    LOG.warning(f"There are {prev_state_transitions - new_state_transitions} "
                            f"fewer state transitions after calling_correlate_events")
                outage_ids = previous_state_df.loc[previous_state_df.prev_sensor_status
                    .isin([POWER_OUTAGE,
                        BROWNOUT])] \
                    .canonical_sensor_id.unique( )
                event_sensor_ids = event_df.canonical_sensor_id.unique( )
                id_diff = set(outage_ids).difference(set(event_sensor_ids))
                if len(id_diff) > 0:
                    LOG.warning(f"There are {len(id_diff)} sensor IDs with outages and no event")
                    state_transition_missing = (state_transition_df.loc
                    [state_transition_df.canonical_sensor_id.isin(outage_ids)])
                    previous_state_missing = (previous_state_df.loc
                    [previous_state_df.canonical_sensor_id.isin(outage_ids)])
                    state_transition_missing.to_csv(f"{cur_time_str}_missing_state_transitions.csv",
                            index=False, index_label=False)
                    previous_state_missing.to_csv(f"{cur_time_str}_missing_previous_state.csv",
                            index=False, index_label=False)
            if prev_time.date( ) != cur_time.date( ):
                complete_events = event_df.loc[event_df.end_time.notnull( ) &
                            (event_df.end_time.dt.date == prev_time.date( ))]
                event_df = event_df.loc[(event_df.end_time.isnull( )) |
                            (event_df.start_time.dt.date > prev_time.date( ))]
                __insert_events(complete_events)
```

```
            with fs.open(f'{EVENT_BUCKET}/{prev_time.strftime('%Y-%m-%d')}_events.csv", 'w') as f:
                complete_events.to_csv(f, index=False, index_label=False)
            # TODO: Temporarily commenting out since this is causing errors
            #LOG.debug("Writing event_df to database")
            #_insert_events(event_df)
            LOG.debug("Writing event_df to bucket")
            with fs.open(f'{EVENT_BUCKET}/{cur_date_str}_events.csv", 'w') as f:
                event_df.to_csv(f, index=False, index_label=False)
            # TODO: Temporarily writing events to both database and file, since
            # this function expects existing events to be in a file.
    except Exception as e:
        exc_type, exc_value, exc_traceback = sys.exc_info( )
        error_send_notification(f'ERROR: Exception in event processing:",
                   traceback.format_exception(exc_type, exc_value, exc_traceback))
        LOG.exception(f'ERROR: Exception in event processing: {repr(e)}")
        traceback.print_exc( )
        LOG.exception(f'ERROR: END")
if __name__ == '__main__':
    argparser = argparse.ArgumentParser( )
    argparser.add_argument(" -- log_level", help="Logging level",
            type=str, required=False, default='info')
    argparser.add_argument("-c", " -- config", help="Name of config file",
            type=str, required=False)
    args = argparser.parse_args( )
    log_level = LOG_LEVEL_DICT[args.log_level]
    LOG.setLevel(log_level)
    logging.basicConfig(format='%(asctime)s - %(levelname)s - %(name)s - %(message)s')
    # first, read in configuration -- the default is to use environment variables
    # for this, but optionally a file passed in on the command line can also be used
    # The config file is json (see event_product_config_TEMPLATE.json) and will read from
    # the dir structure on the VM itself.
    if args.config is None:
        LOG.info("no config file")
        RUN_START_TIME = "" # for later use
        RUN_END_TIME = "" # for later use
        MONITORING_DB_USER = os.environ['MONITORING_DB_USER']
        xxxxx
        MONITORING_DB = os.environ['MONITORING_DB']
        MONITORING_DB_HOST = os.environ['MONITORING_DB_HOST']
        EVENT_BUCKET = os.environ['EVENT_BUCKET']
        PROJ_NAME = os.environ['PROJ_NAME']
        EVENT_DRIVER = os.environ ['EVENT_DRIVER']
        EVENT_USERNAME = os.environ['EVENT_USERNAME']
        xxxxx
        EVENT_DATABASE = os.environ['EVENT_DATABASE']
        EVENT_DB_HOST = os.environ['EVENT_DB_HOST']
    else:
        LOG.info(f"config_file = {args.config}")
        with open(f'{args.config}", 'r') as f:
            config = json.load(f)
        RUN_START_TIME = config['RUN_START_TIME'] # for later use
        RUN_END_TIME = config['RUN_END_TIME'] # for later use
        MONITORING_DB_USER = config['MONITORING_DB_USER']
        xxxxx
        MONITORING_DB = config['MONITORING_DB']
        MONITORING_DB_HOST = config['MONITORING_DB_HOST']
        EVENT_BUCKET = config['EVENT_BUCKET']
        PROJ_NAME = config['PROJ_NAME']
        EVENT_DRIVER = config['EVENT_DRIVER']
        EVENT_USERNAME = config['EVENT_USERNAME']
        xxxxx
        EVENT_DATABASE = config['EVENT_DATABASE']
        EVENT_DB_HOST = config['EVENT_DB_HOST']
    publish_events( )
# usng_utils.py
"""
A module for functions to handle USNG Coordinates
import geopy.distance
import numpy as np
import pyusng
"""
https://gis.stackexchange.com/questions/2951/algorithm-for-offsetting-a-latitude-longitude-by-some-
amount-of-meters
If your displacements aren't too great (less than a few kilometers)
and you're not right at the poles, use the quick and dirty estimate
that 111,111 meters (111.111 km) in the y direction is 1 degree (of latitude)
and 111,111 * cos(latitude) meters in the x direction is 1 degree (of longitude).
"""
COORD_TO_UTM_EAST_MAP = {(-126.0, -120.0): 10, (-120.0, -114.0): 11,
```

```
                    (−114.0, −108.0): 12, (−108.0, −102.0): 13,
                    (−102.0, −96.0): 14, (−96.0, 90.0): 15,
                    (−90.0, −84.0): 16, (−84.0, −78.0): 17,
                    (−78.0, −72.0): 18, (−72.0, −66.0): 19}
UTM_EAST_TO_COORD_MAP = {v: k for k, v in COORD_TO_UTM_EAST_MAP.items( )}
COORD_TO_UTM_NORTH_MAP = {(24.0, 32.0): 'R', (32.0, 40.0): 'S',
                    (40.0, 48.0): 'T', (48.0, 56.0): 'U'}
UTM_NORTH_TO_COORD_MAP = {v: k for k, v in COORD_TO_UTM_NORTH_MAP.items( )}
class USNGCoord:
    USNG_100KM_SQUARE_MAP = {i % 6: f'set{i}'' for i in range(1, 7)}
    USNG_100KM_SQUARE_GRIDS = {f'set{i}':
                    np.genfromtxt(f'usng_100km_squares_set{i}.csv',
                        delimiter=',', dtype='str')
                    for i in range(1, 7)
                    }
    def _init_(self, coord_str, lat, lon):
        usng_split = coord_str.split( )
        if len(usng_split) != 4:
            print(f"Unexpected length of {len(usng_split)} for coordinate: {coord_str}")
        self.gzd = usng_split[0]
        self.gzd_easting = int(self.gzd[0:2])
        self.gzd_northing = self.gzd[2:3]
        self.square_id_100k = usng_split[1]
        self.square_id_100k_easting = self.square_id_100k[0]
        self.grid_100km = USNGCoord. USNG_100KM_SQUARE_GRIDS[
            USNGCoord. USNG_100KM_SQUARE_MAP[int(self.gzd_easting) % 6]]
        self.square_id_100k_northing = self.square_id_100k[1]
        self.grid_coord_easting = int(usng_split[2][0:2])
        self.grid_coord_northing = int(usng_split[3][0:2])
        self.lat = lat
        self.lon = lon
    def __str__(self):
        return       f'{self.gzd}       {self.square_id_100k}       {str(self.grid_coord_easting).zfill(2)}
{str(self.grid_coord_northing).zfill(2)}"
    def get_100km_square_grid(self):
        return
USNGCoord.USNG_100KM_SQUARE_GRIDS[USNGCoord. USNG_100KM_SQUARE_MAP[int(self.gzd_easti
ng) % 6]]
    def get_east_neighbor(self):
        neighbor_coord = self.grid_coord_easting + 1
        cell_loc = np.where(self.grid_100km == self.square_id_100k)
        utm_boundary = UTM_EAST_TO_COORD_MAP[self.gzd_easting]
        if geopy.distance.distance((self.lat, utm_boundary[1]), (self.lat, self.lon)).kilometers <= 1.0:
            # If we're within 1 km of a UTM boundary, transition to the eastern boundary
            neighbor_utm = int(self.gzd_easting + 1)
            neighbor_set = USNGCoord.USNG_100KM_SQUARE_GRIDS[
                USNGCoord.USNG_100KM_SQUARE_MAP[neighbor_utm % 6]]
            square_east_index = 7 − cell_loc[1]
            easting_coord = 99 − self.grid_coord_easting
            return f"{neighbor_utm}{self.gzd_northing} {neighbor_set[cell_loc[0], square_east_index][0]}" \
                f" {easting_coord:02} {self.grid_coord_northing:02}"
        else:
            if neighbor_coord > 99:
                neighbor_coord = neighbor_coord % 100
                return f"{self.gzd} {self.grid_100km[cell_loc[0], (cell_loc[1] + 1) % self.grid_100km.shape [1]][0]}" \
                    f" {neighbor_coord:02} {self.grid_coord_northing:02}"
            else:
                return f"{self.gzd} {self.grid_100km[cell_loc[0], (cell_loc[1]) % self.grid_100km.shape[1]][0]}" \
                    f" {neighbor_coord:02} {self.grid_coord_northing:02}"
    def get_west_neighbor(self):
        neighbor_coord = self.grid_coord_easting − 1
        cell_loc = np.where(self.grid_100km == self.square_id_100k)
        utm_boundary = UTM_EAST_TO_COORD_MAP[self.gzd_easting]
        if geopy.distance.distance((self.lat, utm_boundary[0]), (self.lat, self.lon)).kilometers <= 1.0:
            # If we're within 1 km of a UTM boundary, transition to the western boundary
            neighbor_utm = int(self.gzd_easting − 1)
            neighbor_set = USNGCoord.USNG_100KM_SQUARE_GRIDS[
                USNGCoord. USNG_100KM_SQUARE_MAP[neighbor_utm % 6]]
            square_east_index = 7 − cell_loc[1][0]
            easting_coord = 99 − self.grid_coord_easting
            return f"{neighbor_utm}{self.gzd_northing} {neighbor_set[cell_loc[0], square_east_index][0]}" \
                f" {easting_coord:02} {self.grid_coord_northing:02}"
        else:
            if neighbor_coord < 0:
                neighbor_coord = neighbor_coord % 100
                return f"{self.gzd} {self.grid_100km[cell_loc[0], (cell_loc[1] − 1) % self.grid_100km.shape[1]][0]}" \
                    f" {neighbor_coord:02} {self.grid_coord_northing:02}"
```

```
            else:
                return f"{self.gzd} {self.grid_100km[cell_loc[0], (cell_loc[1]) % self.grid_100km.shape[1]][0]}" \
                    f" {neighbor_coord: 02} {self.grid_coord_northing:02}"
    def get_north_neighbor(self):
        neighbor_coord = self.grid_coord_northing + 1
        cell_loc = np.where(self.grid_100km == self.square_id_100k)
        utm_boundary = UTM_NORTH_TO_COORD_MAP[self.gzd_northing]
            gzd_north_coord = self.gzd_northing
            if geopy.distance.distance((utm_boundary[1], self.lon), (self.lat, self.lon)).kilometers <= 1.0:
            # If we're within 1 km of a UTM North boundary, transition to the northern boundary
            gzd_north_coord = chr(ord(self.gzd_northing) + 1)
            return f"{self.gzd_easting}{gzd_north_coord} {self.grid_100km[cell_loc[0], cell_loc[1][0]}" \
                f" {self.grid_coord_easting:02} {self.grid_coord_northing:02}"
            if neighbor_coord > 99:
            neighbor_coord = neighbor_coord % 100
            return f"{self.gzd_easting}{gzd_north_coord} " \
                f"{self.grid_100km[(cell_loc[0] - 1) % self.grid_100km.shape[0], cell_loc[1][0]}" \
                f" {self.grid_coord_easting:02} {neighbor_coord:02}"
            else:
            return f"{self.gzd_easting}{gzd_north_coord} {self.square_id_100k}" \
                f" {self.grid_coord_easting:02} {neighbor_coord:02}"
    def get_south_neighbor(self):
        neighbor_coord = self.grid_coord_northing - 1
        cell_loc = np.where(self.grid_100km == self.square_id_100k)
        utm_boundary = UTM_NORTH_TO_COORD_MAP[self.gzd_northing]
        gzd_north_coord = self.gzd_northing
        if geopy.distance.distance((utm_boundary[0], self.lon), (self.lat, self.lon)).kilometers <= 1.0:
        # If we're within 1 km of a UTM South boundary, transition to the southern boundary
        gzd_north_coord = chr(ord(self.gzd_northing) - 1)
        return f"{self.gzd_easting}{gzd_north_coord} {self.grid_100km[cell_loc[0], cell_loc[1]][0]}" \
            f" {self.grid_coord_easting:02} {self.grid_coord_northing:02}"
        if neighbor_coord < 0:
        neighbor_coord = neighbor_coord % 100
        return f"{self.gzd_easting}{gzd_north_coord} " \
            f"{self.grid_100km[(cell_loc[0] + 1) % self.grid_100km.shape[0], cell_loc[1][0]}" \
            f" {self.grid_coord_easting:02} {neighbor_coord:02}"
        return f"{self.gzd_easting}{gzd_north_coord} {self.square_id_100k}" \
            f" {self.grid_coord_easting:02} {neighbor_coord:02}"
    def get_northeast_neighbor(self):
        # Get east neighbor then get the north neighbor
        east_neighbor = self.get_east_neighbor( )
        east_neighbor_lat, east_neighbor_lon = pyusng. USNGtoLL(east_neighbor)
        return USNGCoord(east_neighbor, east_neighbor_lat, east_neighbor_lon).get_north_neighbor( )
    def get_northwest_neighbor(self):
        # Get west neighbor then get the north neighbor
        west_neighbor = self.get_west_neighbor( )
        west_neighbor_lat, west_neighbor_lon = pyusng. USNGtoLL(west_neighbor)
        return USNGCoord(west_neighbor, west_neighbor_lat, west_neighbor_lon).get_north_neighbor( )
    def get_southeast_neighbor(self):
        # Get east neighbor then get the north neighbor
        east_neighbor = self.get_east_neighbor( )
        east_neighbor_lat, east_neighbor_lon = pyusng. USNGtoLL(east_neighbor)
        return USNGCoord(east_neighbor, east_neighbor_lat, east_neighbor_lon).get_south_neighbor( )
    def get_southwest_neighbor(self):
        # Get west neighbor then get the north neighbor
        west_neighbor = self.get_west_neighbor( )
        west_neighbor_lat, west_neighbor_lon = pyusng.USNGtoLL(west_neighbor)
        return USNGCoord(west_neighbor, west_neighbor_lat, west_neighbor_lon).get_south_neighbor( )
    def get_all_neighbors(self):
        neighbor_dict = {'east_neighbor': self.get_east_neighbor( ),
            'west_neighbor': self.get_west_neighbor( ),
            'north_neighbor': self.get_north_neighbor( ),
            'south_neighbor': self.get_south_neighbor( ),
            'northeast_neighbor': self.get_northeast_neighbor( ),
            'northwest_neighbor': self.get_northwest_neighbor( ),
            'southeast_neighbor': self.get_southeast_neighbor( ),
            'southwest_neighbor': self.get_southwest_neighbor( )}
        return neighbor_dict
# create_usng_100km_squares.py
"""
A module to create files for USNG 100km squares
"""
import csv
TYPE_1_HORIZ = ['A', 'B', 'C', 'D', 'E', 'F', 'G', 'H']
TYPE_1_VERT = ['V', 'U', 'T', 'S', 'R', 'Q',
        'P','N', 'M', 'L', 'K', ',
        'H', 'G', 'F', 'E', 'D', 'C',
        'B', 'A']
```

-continued

```
TYPE_2_HORIZ = [']', 'K', 'L', 'M', 'N', 'P', 'Q', 'R']
TYPE_2_VERT = ['E', 'D', 'C', 'B', 'A', 'V', 'U',
        'T', 'S', 'R', 'Q', 'P', 'N', 'M',
        'L', 'K', 'J', 'H', 'G', 'F']
TYPE_3_HORIZ = ['S', 'T', 'U', 'V', 'W', 'X', 'Y', 'Z']
HORIZ_TYPES = [TYPE_1_HORIZ, TYPE_2_HORIZ, TYPE_3_HORIZ]
VERT_TYPES = [TYPE_1_VERT, TYPE_2_VERT]
def __create_100km_square_file(square_name, horiz, vert):
    print(f"Creating Square for {square_name}")
    square_100k = [ ]
    for v in vert:
        row = [ ]
        for h in horiz:
            row.append(f"{h}{v}")
        square_100k.append(row)
    print(f"Writing {square_name} to file")
    with open(f'usng_100km_squares_{square_name}.csv', 'w') as f:
        f_writer = csv.writer(f)
        for i in square_100k:
            f_writer.writerow(i)
def __create_usng_100km_square_files( ):
    for i in range(6):
        __create_100km_square_file(f'set{i + 1}',
                    HORIZ_TYPES[i % len(HORIZ_TYPES)],
                    VERT_TYPES[i % len(VERT_TYPES)])
if __name__ == '__main__':
    __create_usng_100km_square_files( )
```

Combinations of Features

Features described above may be combined in various ways without departing from the scope hereof. The following examples illustrate some possible combinations.

(A1) A method for power event notification includes (1) receiving, from a plurality of sensors at different respective locations within an area served by an electric power grid, a respective data set from each sensor, each data set including metadata associated with its respective sensor and electric power data generated by its respective sensor, (2) identifying, from at least one of the data sets, occurrence of an electric power event in the electric power grid, and (3) generating a notification of the electric power event.

(A2) The method denoted as (A1) may further include identifying occurrence of the electric power event from at least two of the data sets.

(A3) In the method denoted as (A1), the at least two data sets may include a first data set and a second data set, the first data set may be received from a first sensor of the plurality of sensors that is configured to monitor a portion of the electric power grid operated by a first electric utility, and the second data set may be received from a second sensor of the plurality of sensors that is configured to monitor a portion of the electric power grid operated by a second electric utility that is different from the first electric utility.

(A4) In any one of the methods denoted as (A2) and (A3), identifying the occurrence of the electric power event may include determining whether there is a correlation between changes in sensor state indicated by the at least two data sets.

(A5) In any one of the methods denoted (A2) through (A4), identifying the occurrence of the electric power event may include determining whether the at least two data sets are from respective sensors of a contiguous geographic area.

(A6) Any one of the methods denoted as (A1) through (A5) may further include determining a severity of the electric power event at least partially based on a quantity of data sets indicating occurrence of the event.

(A7) In any one of the methods denoted as (A1) through (A6), identifying occurrence of the electric power event may include identifying a change in state of one of the plurality of sensors from the respective data set of the sensor.

(A8) In any one of the methods denoted as (A1) through (A7), the plurality of sensors may be out of band with respect to the electric power grid.

(A9) In any one of the methods denoted as (A1) through (A8), the plurality of sensors may be incorporated within one or more communication networks.

(A10) In any one of the methods denoted as (A1) through (A9), each sensor of the plurality of sensors may be incorporated in a respective communication network node.

(A11) In any one of the methods denoted as (A1) through (A10), the electric power data of each data set may represent one or more of (a) voltage of the electric power grid at the location of the sensor generating the data set and (b) operating state of an inverter at the location of the sensor generating the data set.

(A12) In any one of the methods denoted as (A1) through (A11), the metadata of each data set may include one or more of (a) the location of the sensor generating the data set and (b) identification of the sensor generating the data set.

(A13) In any one of the methods denoted as (A1) through (A12), each data set may correspond to a cell of a map of the electric power grid.

(A14) In any one of the methods denoted as (A1) through (A13), the electric power event may include one or more a power outage, an abnormal voltage of the electric power grid, and an abnormal frequency of the electric power grid.

(A15) Any one of the methods denoted as (A1) through (A14) may further include, before identifying occurrence of the electric power event, aggregating the data sets from the plurality of sensors.

(A16) In any one of the methods denoted as (A1) through (A15), generating notification of the electric power event may include one or more of (1) sending an electronic mail (email) message or a text message reporting the electric power event, (2) providing information representing the electric power event to an application programming interface (API), and (3) providing information representing the electric power event to a geographic information system.

(A17) Any one of the methods denoted as (A1) through (A16) may further include determining, from the data sets, a reliability index of the electric power grid at least partially based on a recency-biased conjugate prior probability distribution of voltages of the electric power grid being in compliance with a reference voltage.

(B1) A method for power event notification includes (1) obtaining respective data sets from a plurality of sensors electrically coupled to an electric power grid at different respective locations, (2) aggregating the data sets, and (3) after aggregating the data sets, analyzing the data sets in space and time to identify occurrence of an electric power event.

(B2) In the method denoted as (B1), the plurality of sensors may include a first sensor and a second sensor, the first sensor may be configured to monitor a portion of the electric power grid operated by a first electric utility, and the second sensor may be configured to monitor a portion of the electric power grid operated by a second electric utility that is different from the first electric utility.

(B3) In any one of the methods denoted as (B1) and (B2), the electric power event may include one or more a power outage, an abnormal voltage of the electric power grid, and an abnormal frequency of the electric power grid.

(B4) In any one of the methods denoted as (B1) through (B3), each data set may include (a) metadata associated with its respective sensor and (b) electric power data generated by its respective sensor.

(C1) A method for automatically determining a reliability index of an electric power grid may include (1) receiving a plurality of data sets, each data set including a plurality of voltage measurements from respective sensors at different locations within an area served by the electric power grid, and (2) determining, from the plurality data sets, the reliability index at least partially based on a recency-biased conjugate prior probability distribution of voltages of the electric power grid being in compliance with a reference voltage.

(C2) In the method denoted as (C1), determining, from the plurality data sets, the reliability index at least partially based on the recency-biased conjugate prior probability distribution of voltages of the electric power grid being in compliance with the reference voltage, may include (1) determining, from the plurality of data sets, an upper recency-weighted compliance probability, (2) determining, from the plurality of data sets, a lower recency-weighted compliance probability, and (3) determining the reliability index based at least partially on a product of (a) the upper recency-weighted compliance probability, and (b) the lower recency-weighted compliance probability.

(C3) In the method denoted as (C2), each of the upper recency-weighted compliance probability and the lower recency-weighted compliance probability may include a respective beta function.

(C4) In the method denoted as (C1), determining, from the plurality data sets, the reliability index at least partially based on the recency-biased conjugate prior probability distribution of voltages of the electric power grid being in compliance with the reference voltage, may include determining a combined upper and lower recency-weighted compliance probability.

(C5) In the method denoted as (C4), the combined upper and lower recency-weighted compliance probability may include a beta function.

(C6) Any one of the methods denoted as (C1) through (C5) may further include determining a number of power outages per person in a predetermined area at least partially using the recency-biased conjugate prior probability distribution of voltages of the electric power grid being in compliance with the reference voltage.

Changes may be made in the above methods, devices, and systems without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and system, which as a matter of language, might be said to fall therebetween.

What is claimed is:

1. A method for power event notification, the method comprising:
   at each sensor of a plurality of sensors, generating a respective data set for the sensor, each sensor of the plurality of sensors being at least partially within infrastructure of one or more communication networks that are separate from an electric power grid such that each sensor is separate from the electric power grid, the plurality of sensors being at different respective locations within an area served by the electric power grid;
   at a power event notification system, receiving, from the plurality of sensors at least partially via the one or more communication networks that are separate from the electric power grid, the respective data set for each sensor, each data set including metadata associated with its respective sensor and electric power data generated by its respective sensor;
   at the power event notification system, identifying, from at least one of the data sets, occurrence of an electric power event in the electric power grid; and
   at the power event notification system, generating a notification of the electric power event.

2. The method of claim 1, further comprising identifying occurrence of the electric power event from at least two of the data sets.

3. The method of claim 2, wherein:
   the at least two data sets comprise a first data set and a second data set;
   the first data set is received from a first sensor of the plurality of sensors that is configured to monitor a portion of the electric power grid operated by a first electric utility; and
   the second data set is received from a second sensor of the plurality of sensors that is configured to monitor a portion of the electric power grid operated by a second electric utility that is different from the first electric utility.

4. The method of claim 2, where identifying the occurrence of the electric power event comprises determining whether there is a correlation between changes in sensor state indicated by the at least two data sets.

5. The method of claim 2, wherein identifying the occurrence of the electric power event comprises determining whether the at least two data sets are from respective sensors of a contiguous geographic area.

6. The method of claim 1, further comprising determining a severity of the electric power event at least partially based on a quantity of data sets indicating occurrence of the event.

7. The method of claim 1, wherein identifying occurrence of the electric power event comprises identifying a change in state of one of the plurality of sensors from the respective data set of the sensor.

8. The method of claim 1, wherein the plurality of sensors are out of band with respect to the electric power grid.

9. The method of claim 1, wherein each sensor of the plurality of sensors is incorporated in a respective communication network node.

10. The method of claim 1, wherein the electric power data of each data set represents one or more of (a) voltage of the electric power grid at the location of the sensor generating the data set and (b) operating state of an inverter at the location of the sensor generating the data set.

11. The method of claim 1, wherein the metadata of each data set comprises one or more of (a) the location of the sensor generating the data set and (b) identification of the sensor generating the data set.

12. The method of claim 1, wherein each data set corresponds to a cell of a map of the electric power grid.

13. The method of claim 1, wherein the electric power event comprises one or more of a power outage, an abnormal voltage of the electric power grid, and an abnormal frequency of the electric power grid.

14. The method of claim 1, further comprising, before identifying occurrence of the electric power event, aggregating the data sets from the plurality of sensors.

15. The method of claim 1, wherein generating notification of the electric power event comprises one or more of:
sending an electronic mail (email) message or a text message reporting the electric power event;
providing information representing the electric power event to an application programming interface (API); and
providing information representing the electric power event to a geographic information system.

16. The method of claim 1, further comprising determining, from the data sets, a reliability index of the electric power grid at least partially based on a recency-biased conjugate prior probability distribution of voltages of the electric power grid being in compliance with a reference voltage.

17. The method of claim 1, wherein the infrastructure of the one or more communication networks includes one or more of a fiber node, a wireless base station, an optical network unit (ONU), an optical network terminal (ONT), a digital subscriber line access multiplexer (DSLAM), and a modem.

18. The method of claim 1, wherein the infrastructure of the one or more communication networks is configured to support one or more Wi-Fi wireless communication links.

19. A method for power event notification, the method comprising:
at each sensor of a plurality of sensors, generating a respective data set for the sensor, each sensor of the plurality of sensors being at least partially within infrastructure of one or more communication networks that are separate from an electric power grid such that each sensor is separate from the electric power grid, the plurality of sensors being electrically coupled to the electric power grid at different respective locations;
at a power event notification system, receiving the respective data set for each sensor via the one or more communication networks that are separate from the electric power grid;
at the power event notification system, determining a respective reference value for each sensor from a time series of measurement values from the sensor, each reference value being used as a basis for determining whether a parameter measured by its respective sensor is in conformance with one or more predetermined criteria;
at the power event notification system, aggregating the data sets; and
at the power event notification system and after aggregating the data sets, analyzing the data sets in space and time to identify occurrence of an electric power event.

20. The method of claim 19, wherein:
the plurality of sensors comprises a first sensor and a second sensor;
the first sensor is configured to monitor a portion of the electric power grid operated by a first electric utility; and
the second sensor is configured to monitor a portion of the electric power grid operated by a second electric utility that is different from the first electric utility.

21. The method of claim 19, wherein the electric power event comprises one or more of a power outage, an abnormal voltage of the electric power grid, and an abnormal frequency of the electric power grid.

22. The method of claim 19, wherein each data set includes (a) metadata associated with its respective sensor and (b) electric power data generated by its respective sensor.

23. A method for automatically determining a reliability index of an electric power grid, the method comprising:
at each sensor of a plurality of sensors, generating a respective data set for the sensor, each sensor of the plurality of sensors being at least partially within infrastructure of one or more communication networks that are separate from the electric power grid such that each sensor is separate from the electric power grid, the plurality of sensors being at different locations within an area served by the electric power grid;
at a power event notification system, receiving the respective data sets-set for each sensor at partially via the one or more communication networks that are separate from the electric power grid, each data set including a plurality of voltage measurements; and
at the power event notification system, determining, from the plurality received data sets, the reliability index at least partially based on a recency-biased conjugate prior probability distribution of voltages of the electric power grid being in compliance with a reference voltage.

24. A method for automatically determining a reliability index of an electric power grid, the method comprising:
at each sensor of a plurality of sensors, generating a respective data set for the sensor, each sensor of the plurality of sensors being at least partially within infrastructure of one or more communication networks that are separate from the electric power grid such that each sensor is separate from the electric power grid, the plurality of sensors being at different locations within an area served by the electric power grid;
at a power event notification system, receiving the respective data set for each sensor at least partially via the one or more communication networks that are separate from the electric power grid, each data set including a plurality of voltage measurements from a respective one of the plurality of sensors; and
at the power event notification system, determining, from the received data sets, the reliability index at least partially based on a recency-biased conjugate prior probability distribution of voltages of the electric power grid being in compliance with a reference voltage, at least partially by:
determining, from the received data sets, an upper recency-weighted compliance probability,
determining, from the received data sets, a lower recency-weighted compliance probability, and determining the reliability index based at least partially on a product of (a) the upper recency-weighted compliance probability, and (b) the lower recency-weighted compliance probability.

25. The method of claim 24, wherein each of the upper recency-weighted compliance probability and the lower recency-weighted compliance probability comprises a respective beta function.

26. A method for automatically determining a reliability index of an electric power grid, the method comprising:
at each sensor of a plurality of sensors, generating a respective data set for the sensor, each sensor of the plurality of sensors being at least partially within infrastructure of one or more communication networks that are separate from the electric power grid such that each sensor is separate from the electric power grid, the plurality of sensors at different locations within an area served by the electric power grid;
at a power event notification system, receiving the respective data set for each sensor at least partially via the one or more communication networks that are separate from the electric power grid, each data set including a plurality of voltage measurements; and
at the power event notification system, determining, from the received data sets, the reliability index at least partially based on a recency-biased conjugate prior probability distribution of voltages of the electric power grid being in compliance with a reference voltage, at least partially by determining a combined upper and lower recency-weighted compliance probability.

27. The method of claim 26, wherein the combined upper and lower recency-weighted compliance probability comprises a beta function.

28. A method for automatically determining a reliability index of an electric power grid, the method comprising:
at each sensor of a plurality of sensors, generating a respective data set for the sensor, each sensor of the plurality of sensors being at least partially within infrastructure of one or more communication networks that are separate from the electric power grid such that each sensor is separate from the electric power grid, the plurality of sensors being at different locations within an area served by the electric power grid;
at a power event notification system, receiving the respective data set for each sensor at partially via the one or more communication networks that are separate from the electric power grid, each data set including a plurality of voltage measurements;
at the power event notification system, determining, from the received data sets, the reliability index at least partially based on a recency-biased conjugate prior probability distribution of voltages of the electric power grid being in compliance with a reference voltage; and
at the power event notification system, determining a number of power outages per person in a predetermined area at least partially using the recency-biased conjugate prior probability distribution of voltages of the electric power grid being in compliance with the reference voltage.

* * * * *